(12) United States Patent
Gruening et al.

(10) Patent No.: US 6,319,788 B1
(45) Date of Patent: Nov. 20, 2001

(54) SEMICONDUCTOR STRUCTURE AND MANUFACTURING METHODS

(75) Inventors: Ulrike Gruening, Wappingers Falls, NY (US); Martin Schrems, Dresden (DE); Carl J. Radens, Poughkeepsie, NY (US)

(73) Assignees: Infineon Technologies North America Corp., Cupertino, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/460,701

(22) Filed: Dec. 14, 1999

(51) Int. Cl.[7] .................................................. H01L 21/20
(52) U.S. Cl. ........................................ 438/386; 257/296
(58) Field of Search ............................ 438/386, 52, 244, 438/389, 388; 257/296, 302

(56) References Cited

U.S. PATENT DOCUMENTS

| | | | | |
|---|---|---|---|---|
| 5,482,883 | * | 1/1996 | Rajeevakumar | 437/52 |
| 5,831,301 | * | 11/1998 | Horak et al. | 257/302 |
| 6,008,104 | * | 12/2000 | Schrems et al. | 438/386 |
| 6,018,174 | * | 1/2000 | Schrems et al. | 257/296 |
| 6,025,245 | * | 2/2000 | Wei | 438/386 |

* cited by examiner

*Primary Examiner*—Matthew Smith
*Assistant Examiner*—Calvin Lee
(74) *Attorney, Agent, or Firm*—Stanton C. Braden

(57) ABSTRACT

A method for fabricating a trench capacitor wherein the trench in the substrate. The walls of the trench are lined with a semiconductor material having a substantially uniform thickness over sidewalls of the trench, such trench being void of the material in an inner region of the trench. A dielectric collar is formed in an upper portion of the trench above the semiconductor material. The semiconductor material is removed from the bottom portion of the trench. A node dielectric is formed that lines the collar and trench sidewalls at the bottom portion of the trench. The trench is filed with a doped semiconductor material, such doped semiconductor material providing an electrode of the trench capacitor. The trench is forming includes forming the trench with a diameter of the lower portion of the trench effectively at least equal to about the upper portion of the trench.

7 Claims, 26 Drawing Sheets

US 6,319,788 B1

SEMICONDUCTOR STRUCTURE AND MANUFACTURING METHODS

BACKGROUND OF THE INVENTION

The invention generally relates to device and device fabrication and, more particularly, to a trench capacitor.

As is known in the art, integrated circuits (ICs) or chips employ capacitors for charge storage purposes. An example of an IC that employs capacitors for storing charge is a memory IC, such as a dynamic random access memory (DRAM) chip. The level of the charge ("0" or "1") in the capacitor represents a bit of data.

A DRAM chip includes an array of memory cells interconnected by rows and columns. Typically, the row and column connections are referred to as wordlines and bitlines, respectively. Reading data from or writing data to the memory cells is accomplished by activating the appropriate wordlines and bitlines.

Typically, a DRAM memory cell comprises a transistor connected to a capacitor. The transistor includes two diffusion regions separated by a channel, above which is located a gate. Depending on the direction of current flow between the diffusion region, one is referred to as the drain and the other the source. The terms "drain" and "source" are herein used interchangeably to refer to the diffusion regions. The gate is coupled to a wordline and one of the diffusion regions is coupled to a bitline. The other diffusion region is coupled to the capacitor. Applying an appropriate voltage to the gate switches the transistor on, enabling current to flow through channel between the diffusion regions to form a connection between the capacitor and bitline. Switching off the transistor severs this connection by preventing current flowing through the channel.

The charge stored in the capacitor dissipates over time due to current leakage therefrom. Before the charge dissipates to an indeterminate level (below a threshold), the node has to be refreshed.

Continued demand to shrink devices has facilitated the design of DRAMs having greater density and smaller feature size and cell area. To produce cells that occupy less surface area, smaller components such as capacitors are used. However, the use of smaller capacitors results in decreased storage capacity, which can adversely affect the performance and operability of the memory device. For example, sense amplifiers require an adequate signal level to reliably sense the information in the cells. The ratio of storage capacitance to bitline capacitance is crucial in determining the signal level. If the capacitor becomes too small, this ratio may be too small to provide an adequate signal. Also, smaller storage capacity requires higher refresh frequency.

One type of capacitor that is are commonly employed in DRAMs is a trench capacitor. A trench capacitor is a three-dimensional structure formed in the silicon substrate. Increasing the volume or capacitance of the trench capacitor can be achieved by etching deeper into the substrate. As such, increasing the capacitance of the trench capacitor does not increase the surface area of the cell.

A conventional trench capacitor comprises a trench etched into the substrate. The trench is typically filled with n+ doped poly which serves as an electrode of the capacitor (referred to as the storage node). Optionally, a second electrode of the capacitor, referred to as a "buried plate," is formed by out-diffusing n+ dopants from a dopant source into a region of the substrate surrounding the lower portion of the trench. A n+ doped silicate glass such as Arsenic doped silicate glass (ASG) serves as the dopant source. A node dielectric comprising nitride is provided to separate the two electrodes of the capacitor.

In the upper portion of the trench, a dielectric collar is provided to prevent leakage from the node junction to the buried plate. The node dielectric in the upper portion of the trench where the collar is to be formed is removed prior to its formation. Removal of the nitride prevents vertical leakage along the collar.

However, the removal of the upper portion of the nitride layer creates pinholes at the transition between the bottom part the collar and upper edge of the node dielectric. Pinholes degrade the integrity of the node dielectric, and are a substantial source of charge leakage from the trench. This reduces the retention time of the trench capacitor, adversely impacting performance.

To prevent the formation of pinholes, a two step trench etch process has been proposed. First, the trench is partially etched by a reactive ion etch (RIE) to the depth of the collar. The RIE is selective to the hard etch mask. Typical chemistry employed for the RIE includes, for example, $NF_3/HBr/He/O_2$. An oxide layer is deposited and etched to form the collar on the trench sidewalls. The etch, which is a RIE, is selective to silicon using, for example, $CHF_3/He/O_2$, $CHF_3/Ar$, $C_4F_8/Ar$, or $CF_4$ chemistry. The remaining portion of the trench is etched after collar formation. The node dielectric is then formed over the collar and lower portion of the trench sidewalls. Such a process eliminates the need to remove the upper portion of the node dielectric, thus avoiding pinholes from forming.

Although such two step trench formation is effective in preventing pinholes, the second RIE step for removing silicon may cause excessive erosion of the collar. Degradation of the collar causes leakage to occur. Furthermore, the collar acts as a hard etch mask for the second RIE trench etch, producing a lower portion of the trench having a diameter which is equal to that of the inner circumference of the collar. Thus, the lower portion of the trench is smaller than the upper portion, which has a diameter equal to about the outer circumference of the collar. This is undesirable as it reduces the capacitance of the capacitor.

From the above description, it is desirable to provide a trench capacitor with reduced charge leakage and increased capacitance.

SUMMARY OF THE INVENTION

The invention relates to an improved trench capacitor, such as one employed in a memory cell. In one embodiment, the trench capacitor is employed in a DRAM cell of a DRAM or an embedded DRAM chip. The trench capacitor is formed by forming the trench in the substrate. The trench is filled with a semiconductor material. In one embodiment, the semiconductor material comprises silicon such as polycrystalline silicon (poly) or amorphous silicon. The semiconductor material in the upper portion of the trench is removed and a dielectric collar is formed therein. The silicon material is then removed from the bottom portion of the trench. Subsequently, a node dielectric that lines the collar and trench sidewalls at the bottom portion of the trench is formed. The trench is filled with a doped material that serves as an electrode of the trench capacitor.

In accordance with one embodiment, a method for fabricating a trench capacitor is provided. The method includes forming a trench in the substrate. Walls of the trenched are lined with a semiconductor material having a substantially uniform thickness over sidewalls of the trench. A dielectric collar is formed in an upper portion of the trench above the semiconductor material. The semiconductor material is removed from the bottom portion of the trench. A node dielectric is formed to line the collar and trench sidewalls at the bottom portion of the trench. The trench is filed with a doped semiconductor material, such doped semiconductor material providing an electrode of the trench capacitor.

In one embodiment of the invention, the method includes forming a bottle-shaped trench in the substrate. The walls of the trench are lined with a semiconductor material having a substantially uniform thickness over sidewalls of the trench, such trench being void of the material in an inner region of the trench. A dielectric collar is formed in an upper portion of the trench above the semiconductor material. The semiconductor material is removed from the bottom portion of the trench. A node dielectric is formed that lines the collar and trench sidewalls at the bottom portion of the trench. The trench is filed with a doped semiconductor material, such doped semiconductor material providing an electrode of the trench capacitor. The trench is forming includes forming the trench with a diameter of the lower portion of the trench effectively at least equal to about the upper portion of the trench.

Figure 3:
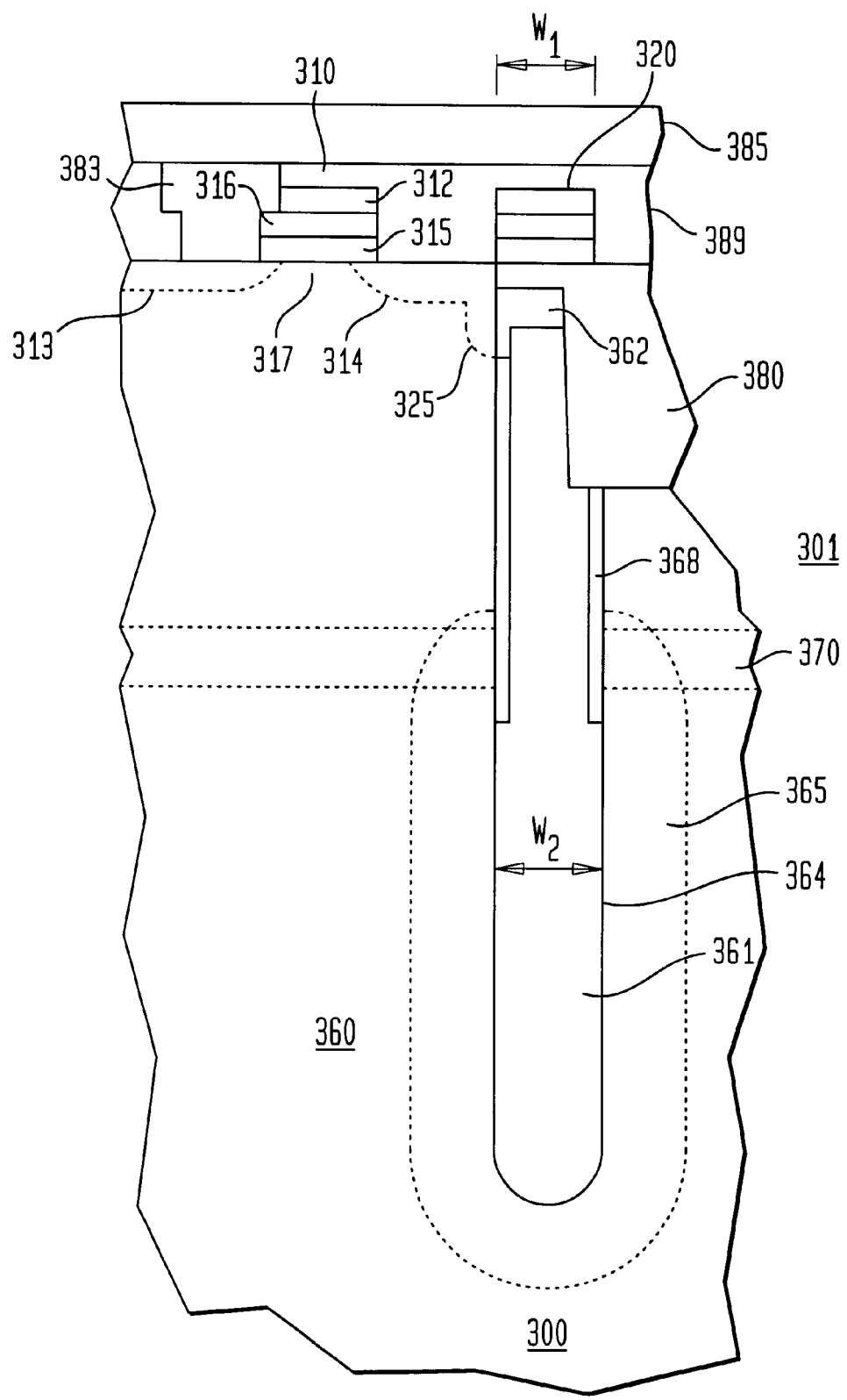
FIG. 3 shows a DRAM cell in accordance to one embodiment of the invention.

4A–4H show a process in accordance with one embodiment of the invention for forming the DRAM cell of FIG. 3.

Figure 5:
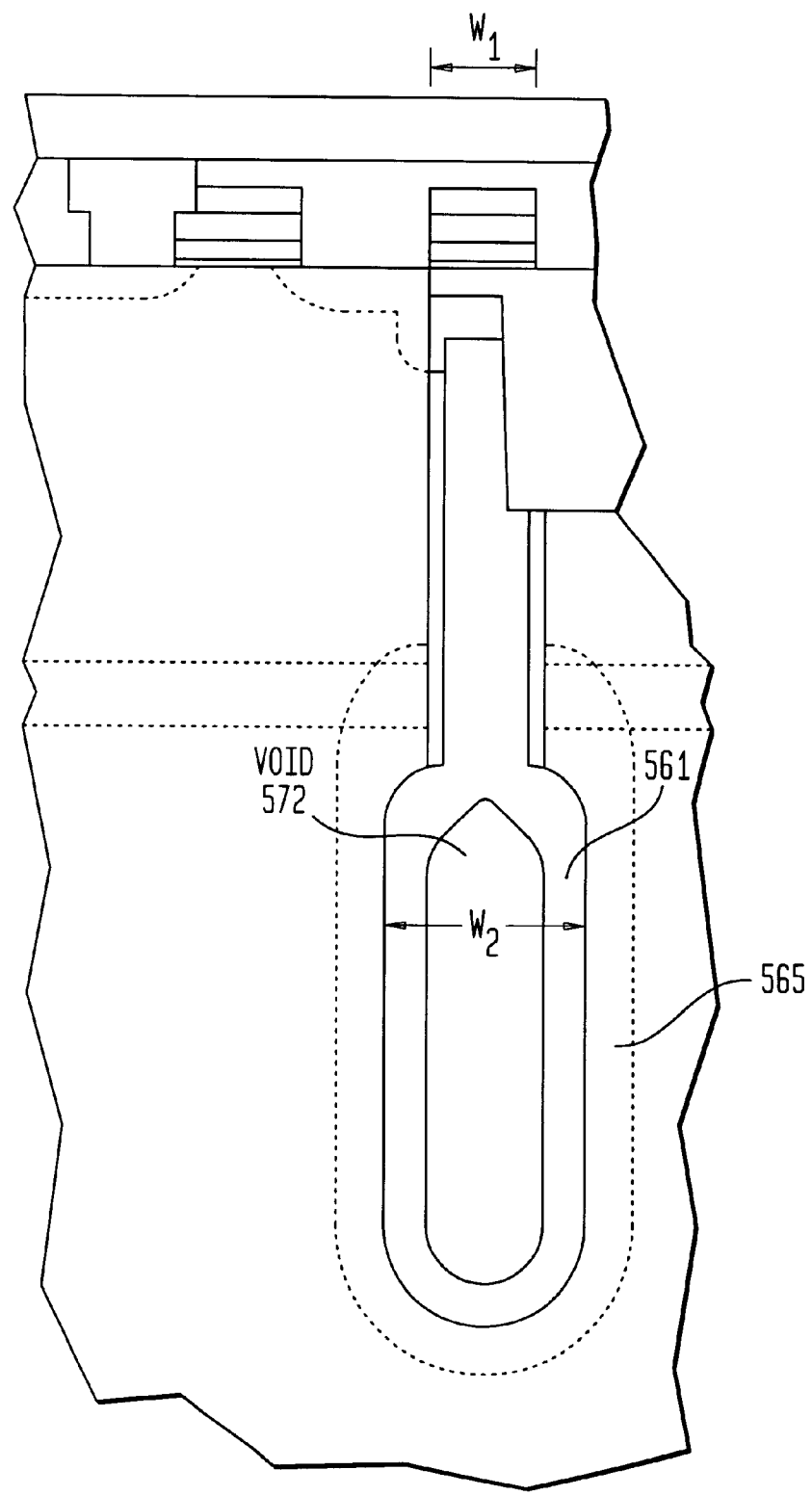
Figure 6A:
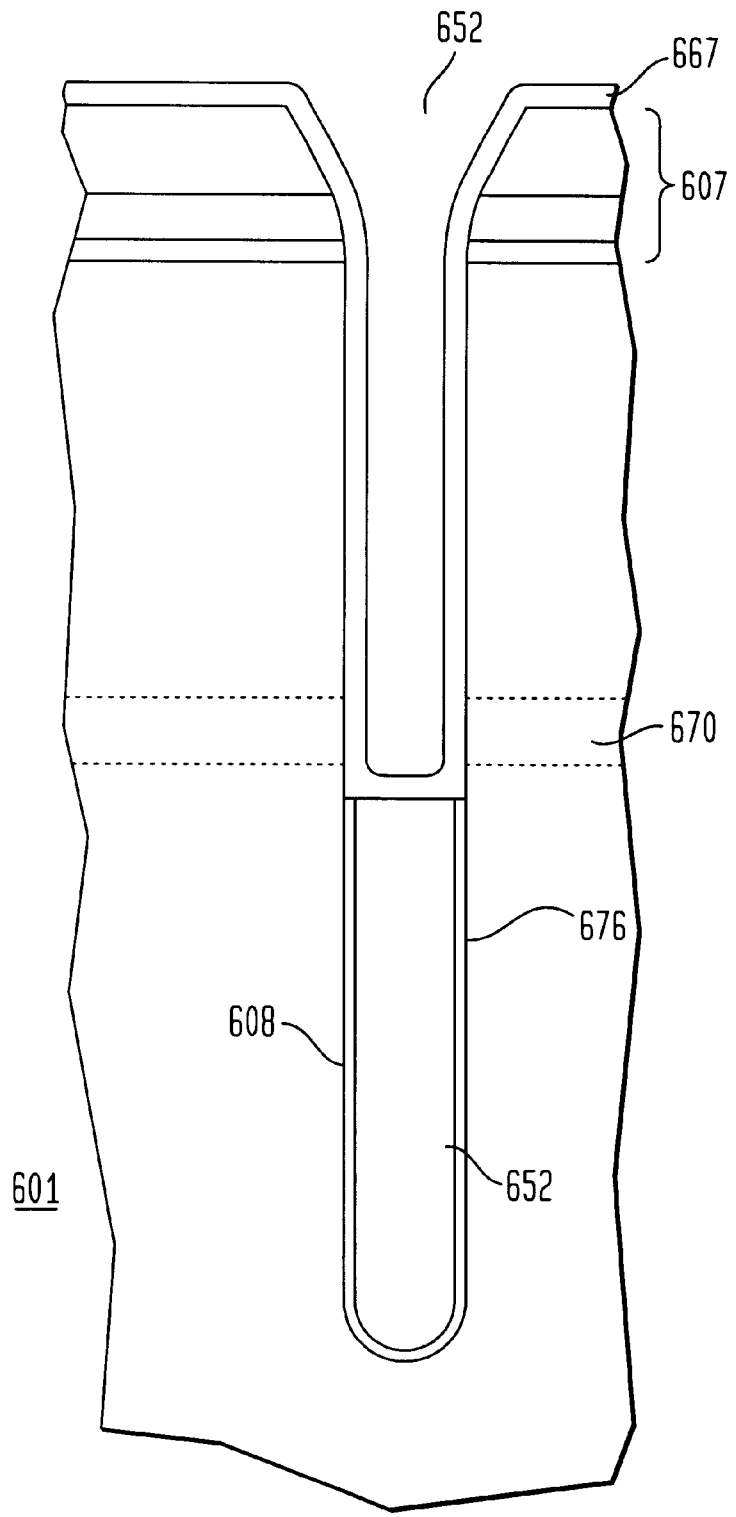
Figure 6B:
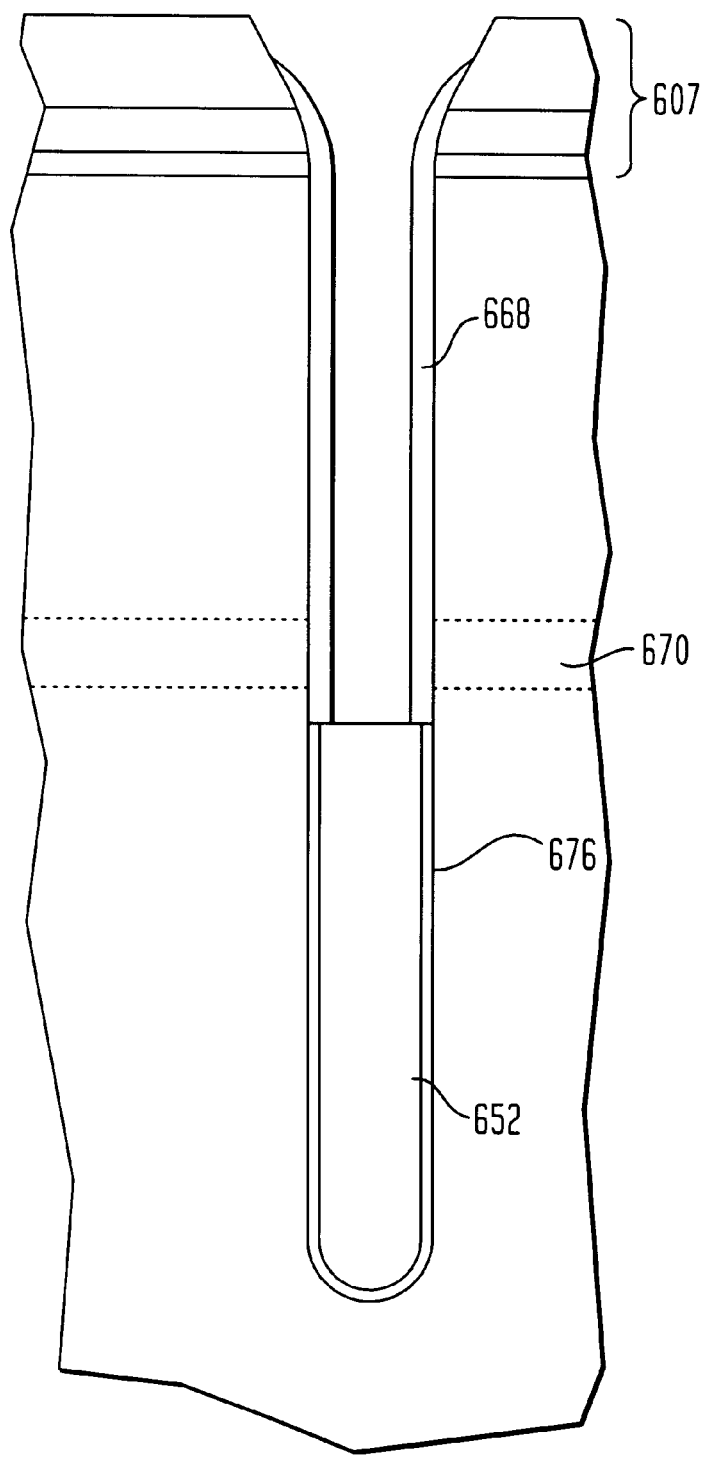
Figure 6C:
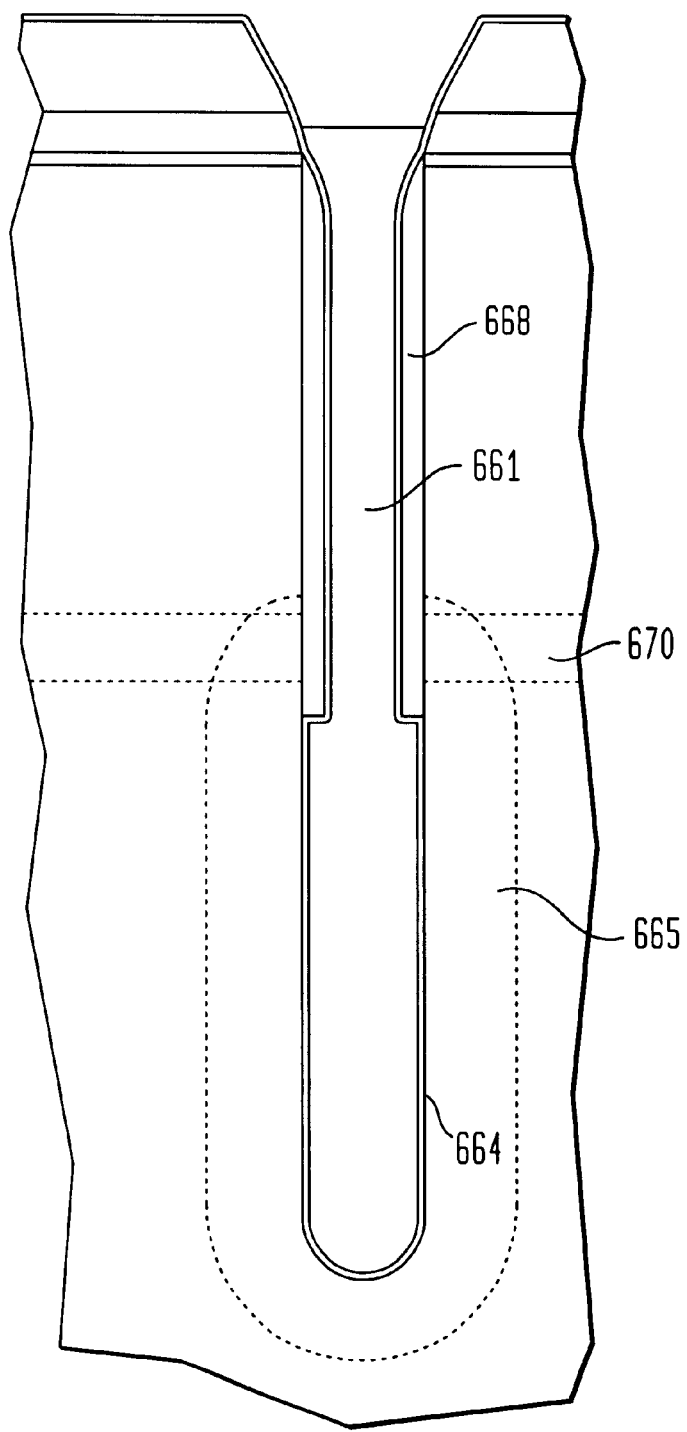
Figure 7A:
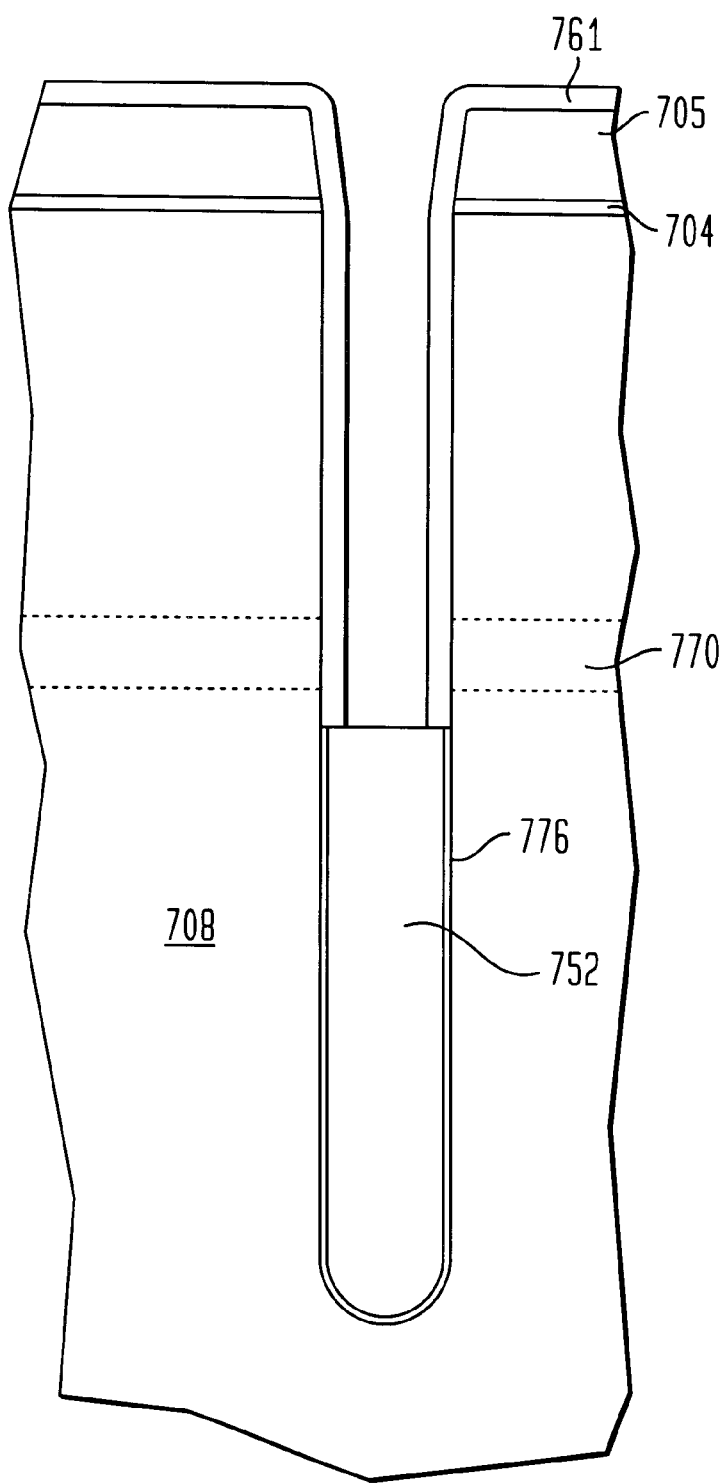
Figure 7B:
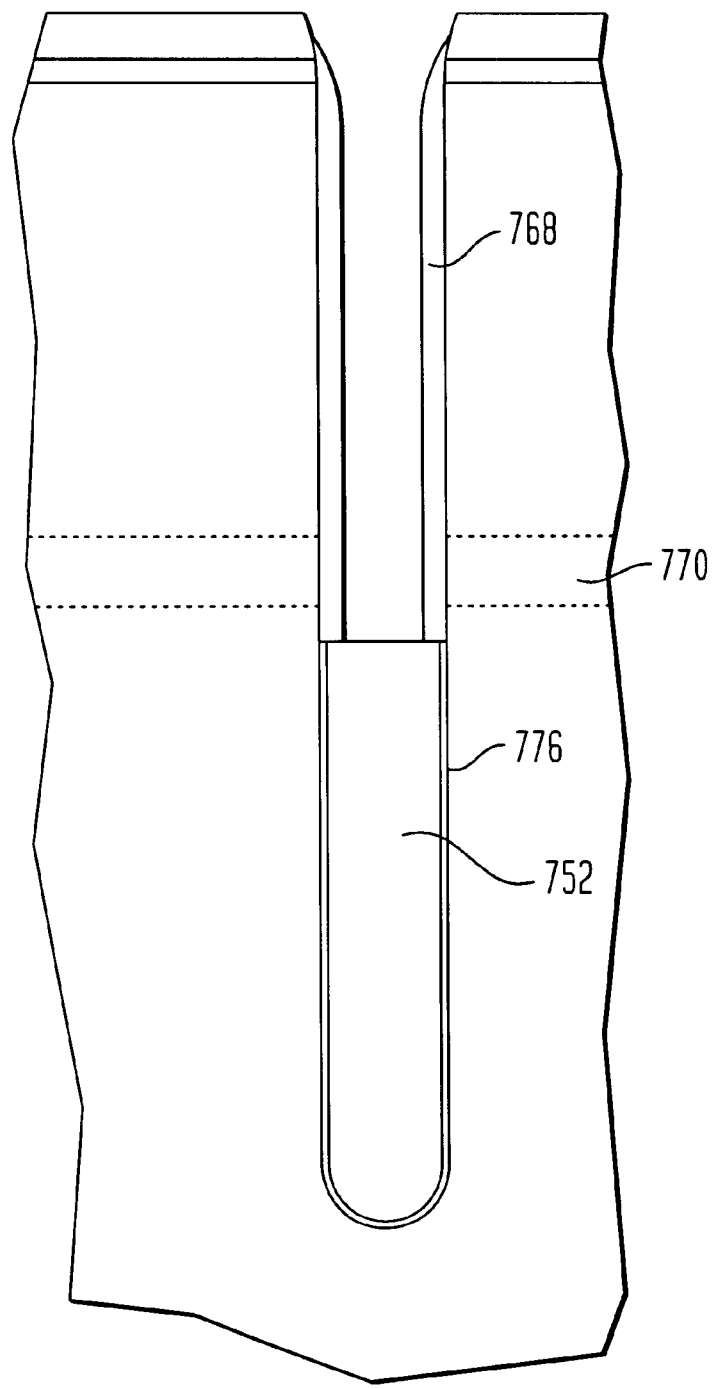
Figure 7C:
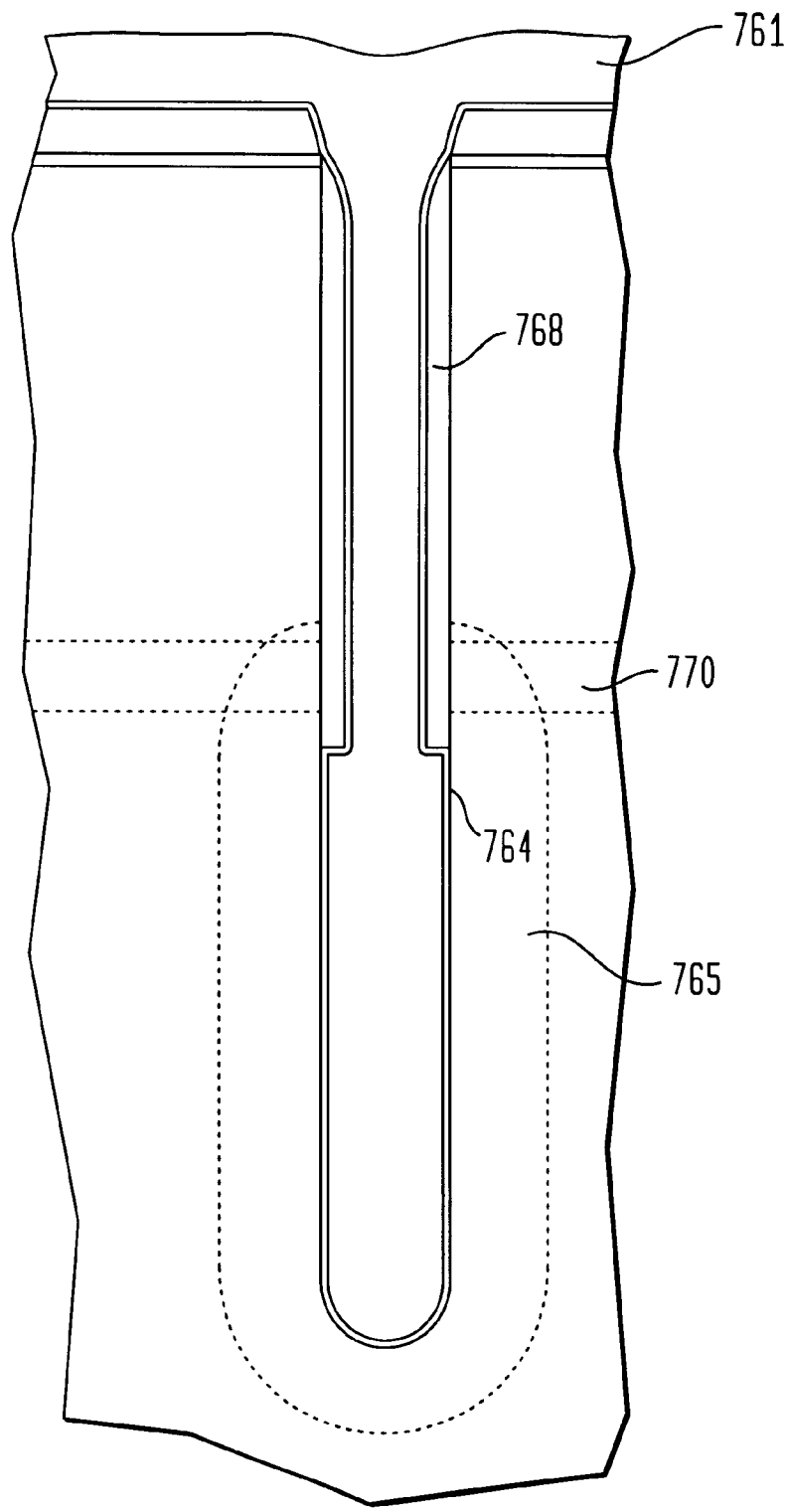
Figure 8:
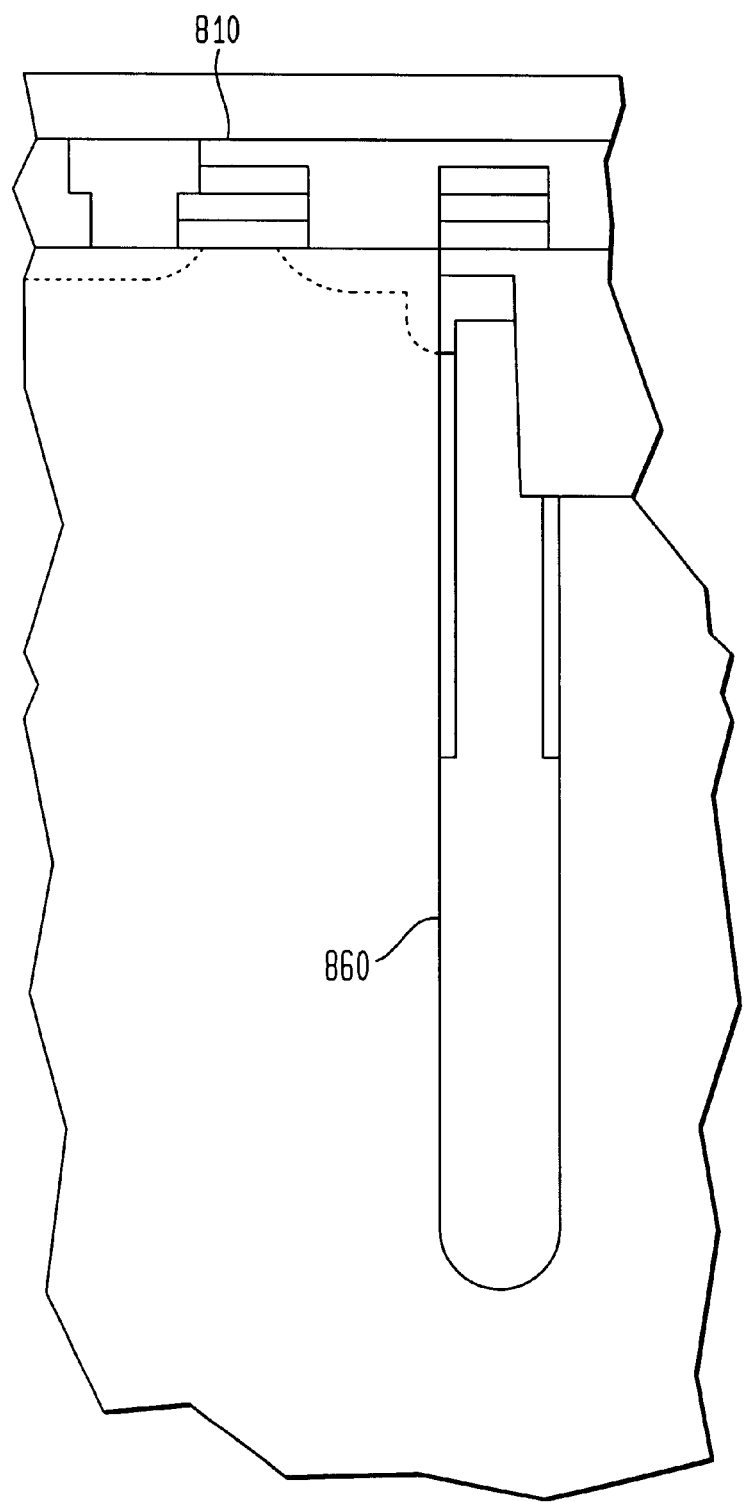

FIG. 5 shows an alternative embodiment of the invention;

FIGS. 6A–6C show another process for forming an embodiment of the invention;

FIGS. 7A–7C show yet another process for forming an embodiment of the invention;

FIG. 8 shows another embodiment of the invention.; and

FIGS. 9A–9E show yet another process for forming an embodiment of the invention.

DESCRIPTION OF THE PREFERRED EMBODIMENTS

The present invention relates trench capacitors, such as those implemented in a memory cell. For purposes of illustration, the present invention is described in the context of a trench capacitor DRAM cell. However, the invention is significantly broader and extends to trench capacitor cells in general. Such cells are employed in integrated circuits (ICs) like, for example, random access memories (RAMs), dynamic RAMs (DRAMs), synchronous DRAMs (SDRAMs), static RAMs (SRAMs), and read only memories (ROMs). Other ICs include logic devices such as programmable logic arrays (PLAs), application specific ICs (ASICs), merged logic/memory ICs (embedded DRAMs), or any circuit devices.

Typically, a plurality of ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other products. For purposes of discussion, the invention is described in the context of forming a single cell. A description of a conventional trench capacitor DRAM cell is provided before describing the invention.

Figure 1:
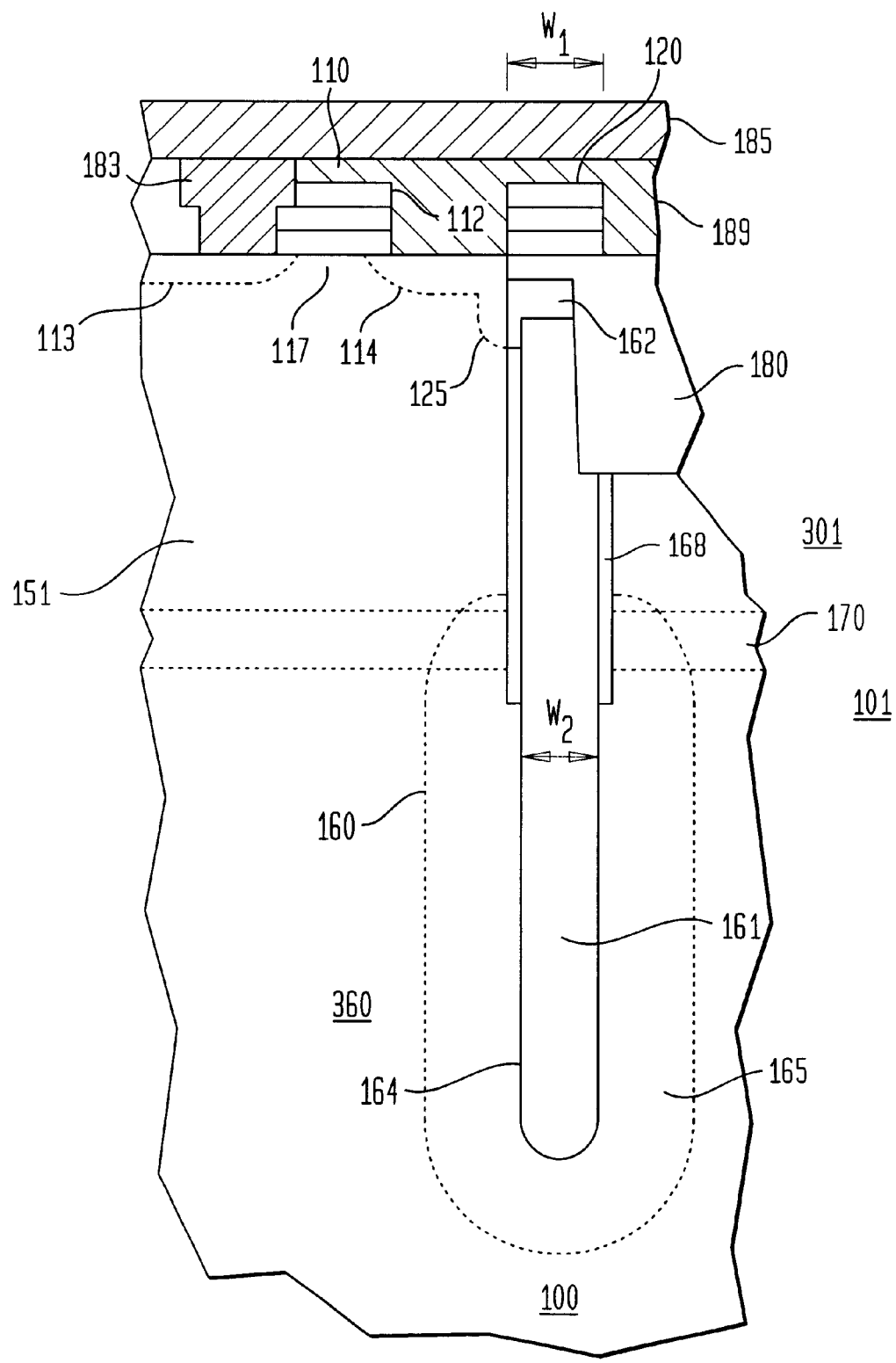
FIG. 1 shows a conventional DRAM cell.

Referring to FIG. 1, a conventional trench capacitor DRAM cell 100 is shown. Such conventional trench capacitor DRAM cell is described in, for example, Nesbit et al., *A 0.6 $\mu m^2$ 256 Mb Trench DRAM Cell With Self-Aligned Buried Strap (BEST)*, IEDM 93-627, which is herein incorporated by reference for all purposes. Typically, an array of cells is interconnected by wordlines and bitlines to form a DRAM chip.

The DRAM cell comprises a trench capacitor 160 formed in a substrate 101. The substrate is lightly doped with p-type dopants ($p^{31}$), such as boron (B). The trench is filled with, typically, polysilicon (poly) 161 heavily doped with n-dopants (n+), such as arsenic (As) or phosphorous (P). Optionally, a buried plate 165 doped with, for example, As is provided in the substrate surrounding the lower portion of the trench. The As is diffused into the silicon substrate from a dopant source, such as ASG, that is formed on the sidewalls of the trench. The poly and buried plate serve as the electrodes of the capacitor. A node dielectric 164 separates the electrodes.

The DRAM cell also comprises a transistor 110. The transistor includes gate 112 and diffusion regions 113 and 114. The diffusion regions, which are separated by a channel 117, are formed by implanting n-type dopants such as phosphorus (P). A node diffusion region 125, referred to as the "node junction," couples the capacitor to the transistor. The node diffusion region is formed by out diffusing dopants from the trench poly through a buried strap 162.

A collar 168 is formed at an upper portion of the trench. As used herein, the upper portion of the trench refers to the section that includes the collar and the lower portion includes the section below the collar. The collar prevents leakage of the node junction to the buried plate. Leakage is undesirable as it degrades the retention time of the cell, increasing the refresh frequency which adversely impacts performance.

A buried well 170 comprising n-type dopants, such as P or As, is provided below the surface of the substrate. The peak concentration of dopants in the buried n-well is at about the bottom of the collar. Typically, the well is lightly doped compared to the buried plate. The buried well serves to connect the buried plates of the DRAM cells in the array.

Activation of the transistor by providing the appropriate voltages at the gate and bitline accesses the trench capacitor. Generally, the gate forms a wordline and the diffusion region 113 is coupled to a bitline 185 in the DRAM array via a contact 183. The bitline 185 is isolated from the diffusion region by an interlevel dielectric layer 189.

A shallow trench isolation (STI) 180 is provided to isolate the DRAM cell from other cells or devices. As shown, a wordline 120, is formed over the trench and isolated therefrom by the STI. Wordline 120 is referred to as the "passing wordline." Such a configuration is referred to as a folded bitline architecture. A liner (not shown) lines the bitline contact, isolating it from the gate.

Figure 2A:
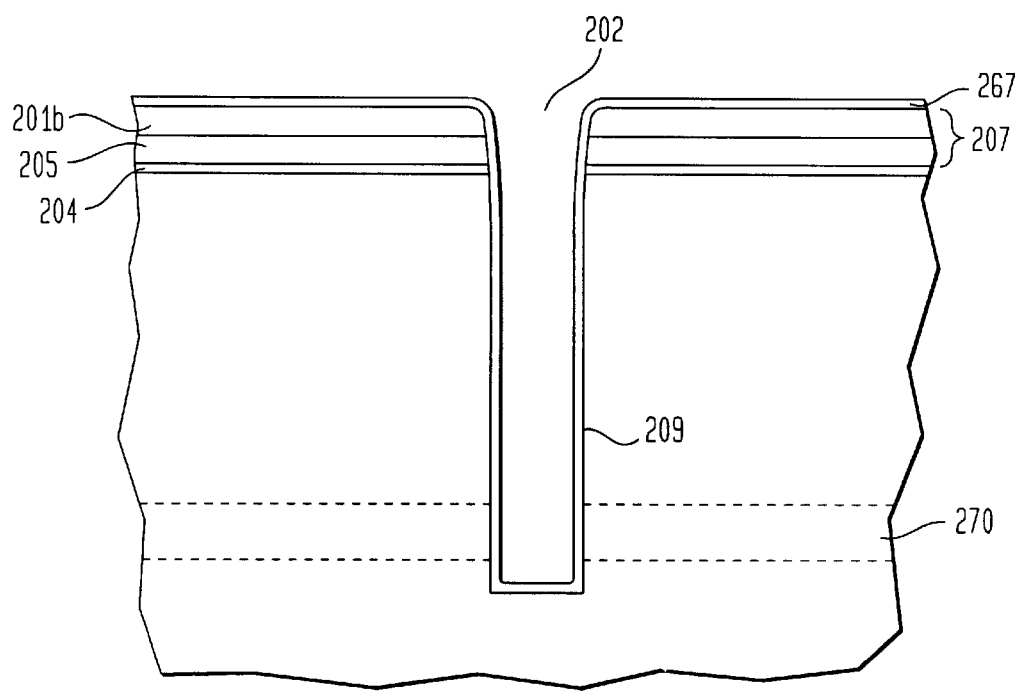
FIGS. 2A–C show a process for forming the conventional DRAM cell.
Figure 2B:
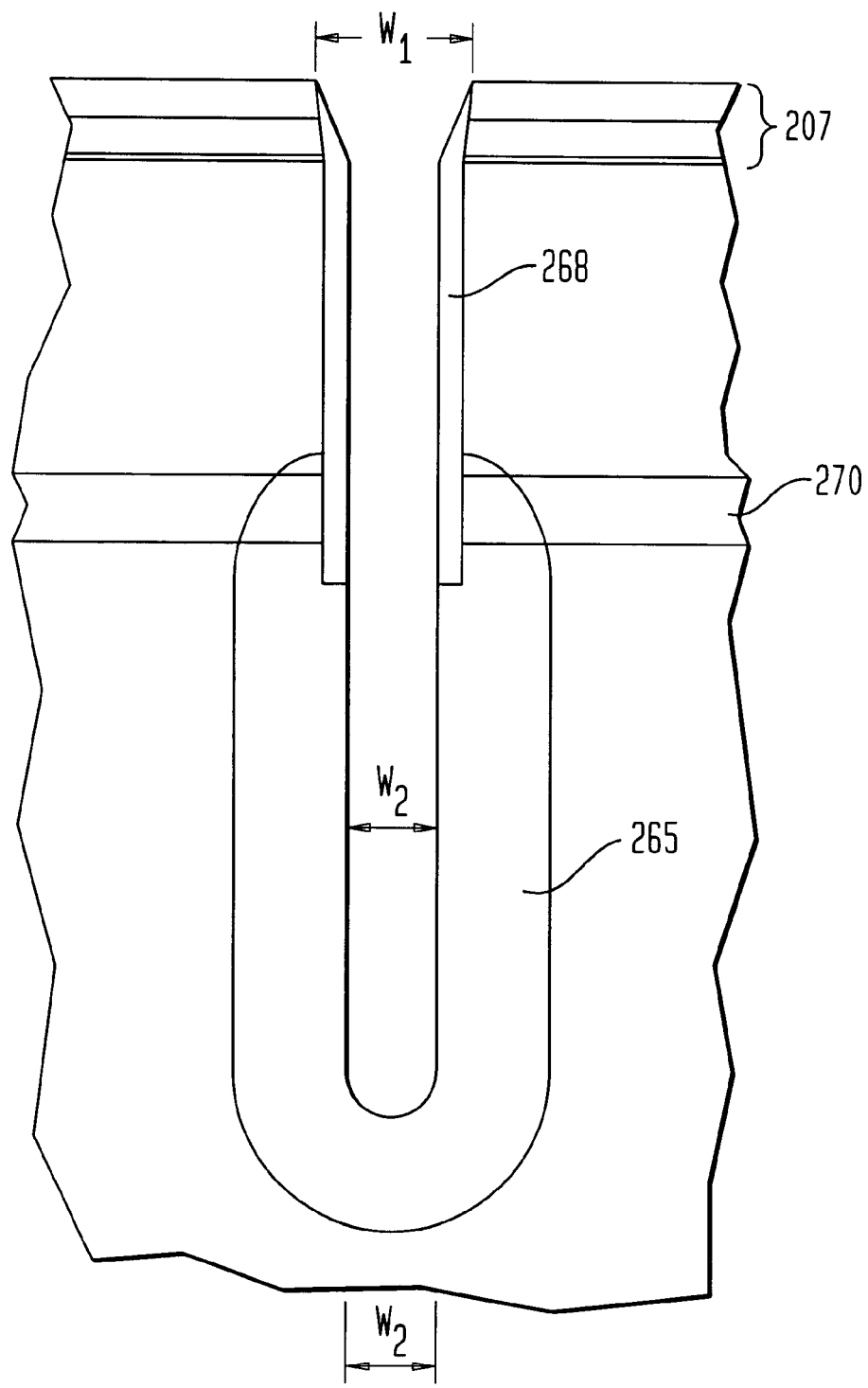
Figure 2C:
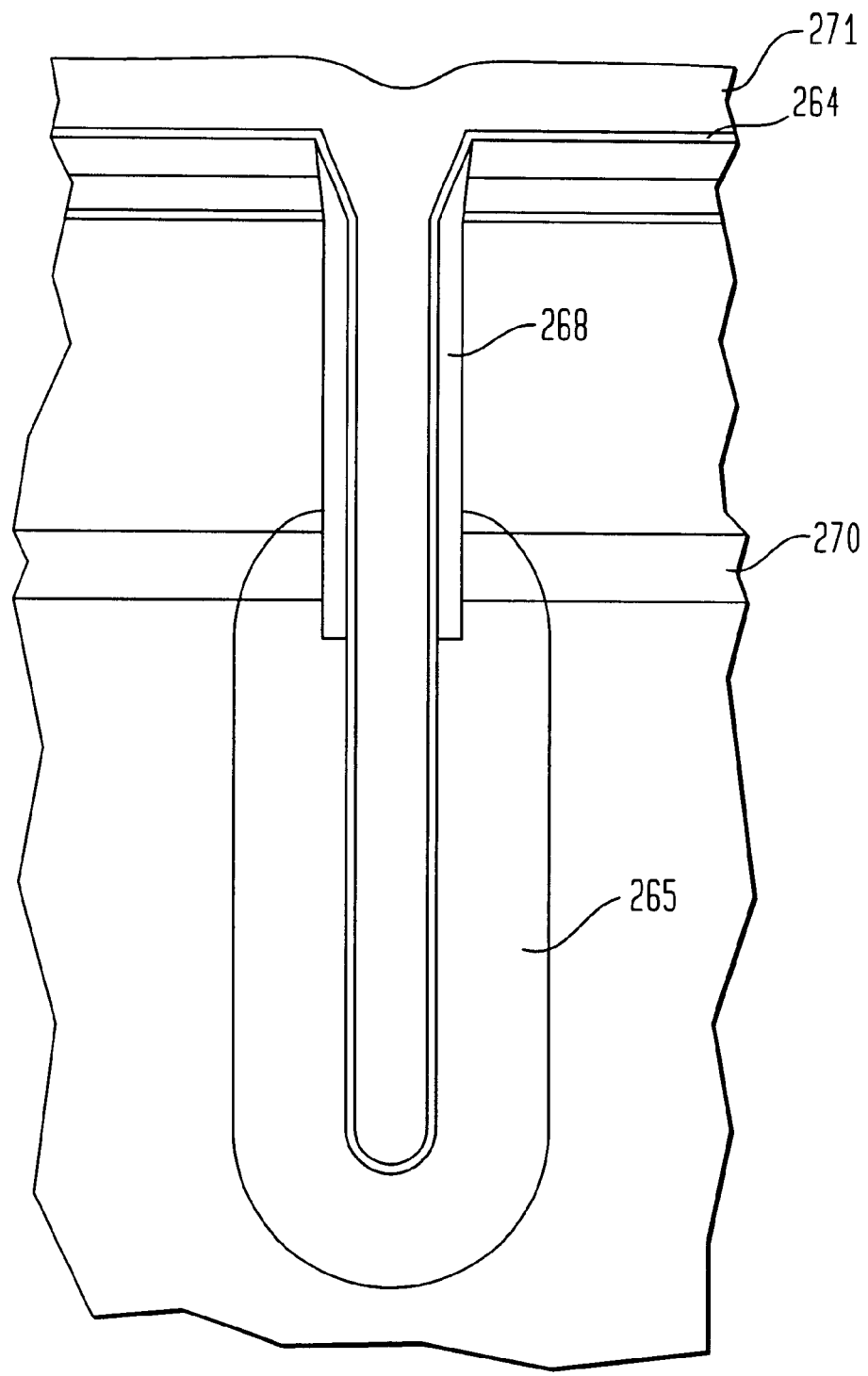

FIGS. 2A–2C show the two step trench etch process for forming a trench capacitor. Referring to FIG. 2A, a pad stack 207 is formed on the surface of the substrate 201. The substrate includes a buried n-well that is used to connect the buried plates of the trench capacitors. The pad stack comprises various layers, including a hard mask layer 206, pad stop layer 205, and a pad oxide layer 204. The hard mask layer is patterned using conventional lithographic techniques to define a region 202 in which a trench is to be formed. A first RIE is performed to form a trench 209 having a depth equal to the depth of the collar.

An oxide layer 267, such as TEOS, is deposited on the wafer, covering the pad stack and sidewalls of the trench. The oxide layer serves as the collar. An anneal is performed to densify the oxide layer to improve the quality of the oxide.

Referring to FIG. 2B, the oxide at the bottom of the trench is removed. A RIE such as, for example, an oxide plasma etch is employed to remove the excess oxide. A second RIE is performed in order to form the lower portion of the trench. The second RIE is, for example, a silicon plasma etch. The collar acts as an etch mask during the RIE. As a result, the lower portion of the trench has a width of $W_2$, which is less than width $W_1$ of the upper portion of the trench. This is undesirable as it reduces the capacitance of the trench capacitor. Also, the second RIE may erode the upper portion of the collar, leading to leakage which adversely impacts the retention time of the capacitor.

After the formation of lower portion of the trench, an n-type buried plate 265 is optionally formed. The buried plate is formed by, for example, gas phase doping, plasma doping, or ion implantation. Alternatively, doped silicate glass is deposited to line the trench sidewalls to provide a dopant source from which dopants diffuse into the substrate by a drive in anneal. Removal of the doped silicate glass is achieved by, for example, chemical etching with BHF.

Referring to FIG. 2C, a node dielectric layer 264 is deposited on the wafer, lining the trench sidewalls. The trench is then filled with poly 271. The trench fill process also covers the surface of the wafer with poly. The poly is heavily doped with n-type dopants.

The process continues to form the remaining portions of the DRAM cell as shown in FIG. 1. This includes recessing the poly, collar, and node dielectric in the trench and forming the strap, defining the isolation region to form the STI, depositing and patterning the various layers comprising the gate stack, depositing an interlevel dielectric layer, creating contact opening, and forming a bitline. Such processes are described in, for example, Nesbit et al., *A 0.6 $\mu m^2$ 256 Mb Trench DRAM Cell With Self-Aligned Buried Strap (BEST)*, IEDM 93-627; and EI-Kareh et al., *Solid State Technology*, p-89, (May 1997), which are already herein incorporated by reference for all purposes.

In accordance with the invention, an improved trench capacitor is provided. The trench capacitor comprises a node dielectric that is formed over the collar, eliminating the need to remove the upper portion of the node dielectric layer. This avoids the formation of pinholes at the transition of the collar and upper edge of the dielectric layer. Additionally, lower portion of the trench comprises a width or diameter that is at least equal to about the width or diameter of the upper portion. As such, reduced leakage and increased capacitance is achieved.

FIG. 3 shows a trench capacitor 360 implemented in a DRAM cell 300 in accordance with one embodiment of the invention. Illustratively, the DRAM cell is a merged isolation node trench (MINT) cell with a buried strap. Other cell configurations, such as those utilizing a surface strap, are also useful. Typical dimensions of a trench in, for example, a 256 megabit DRAM chip using 0.25 $\mu m$ design rules is about 7–8 $\mu m$ deep, with a trench opening of about 0.25 $\mu m$ by 0.50 $\mu m$.

As shown, the trench capacitor is formed in a substrate 301. The substrate, for example, is lightly doped with dopants having a first electrical type. In one embodiment, the substrate is lightly doped with p-type dopants ($p^-$), such as B. The use of a heavily doped p-type (p+) substrate is also useful. For example, p+/p− epi substrates can be used. Such substrates comprise a dopant concentration of about $10^{19}$ $cm^{-3}$ with a $p^-$ epi layer of typically about 2–3 $\mu m$ thick. The concentration of B is about $1.5 \times 10^{16}$ $cm^{-3}$. A p-type well 351 is provided for isolation of the array devices 110. The dopant concentration of the p-well is about $5 \times 10^{17}$–$8 \times 10^{17}$ $cm^{-3}$.

In accordance with the invention, the lower portion of the trench has a width or diameter $W_2$ that is effectively about equal to or greater than about $W_1$ of the upper portion. Optionally, a buried plate 365 surrounds the lower portion of the trench. As shown, the buried plate overlaps partially with the upper portion of the trench. The buried plate serves as an electrode of the capacitor. Typically, the trench comprises a semiconductor material 320 heavily doped with dopants having a second electrical type. The semiconductor material is, for example, poly. The poly, for example, is heavily doped with n-type dopants ($n^+$) such as As or P. In one embodiment, the poly is heavily doped with As. The concentration of As is about $10^{19}$–$10^{20}$ $cm^{-3}$.

A node dielectric layer 364 separates the electrodes of the capacitor. In accordance with the invention, the node dielectric lines the inner sidewalls of the collar and the trench sidewalls in the lower portion of the trench. The dielectric layer comprises, for example nitride or nitride/oxide. Oxide/nitride/oxide or other suitable dielectric layer or stack of layers such as oxide, nitridized oxide, or NONO are also useful.

Connecting the buried plate 365 of the capacitor with other capacitors within the DRAM array is a buried well 370 comprising dopants of second conductivity. In one embodiment, the buried well formed by implanting n-type dopants, such as As or P. The concentration of the well is about $1 \times 10^{17}$–$1 \times 10^{20}$ $cm^{-3}$. The buried well may also be formed with an n-type epi layer and is connected to a reference voltage. By connecting the buried plates of the capacitors in the DRAM array to a common reference voltage, the maximum electric field in the dielectric layer is minimized, thus improving reliability. In one embodiment, the reference voltage is midway between the bitline low and high voltage limits, commonly referred to as $V_{DD}/2$. Other reference voltage such as ground is also useful.

A strap 362 is provided above the doped poly. Dopants from the doped poly 361 out-diffuse into the silicon, forming a node diffusion region 325 or node junction to couple the transistor and capacitor. Although the illustrative embodiment is described with a buried strap, the use of, for example, a surface strap is also useful.

A collar 368 is provided in the upper portion of the trench and extends to about the top of the buried plate. As shown, the collar is slightly recessed below the substrate surface to accommodate a buried strap 362. The collar comprises a dielectric material. In one embodiment, a thermal oxide layer is first formed and then a TEOS layer is deposited thereon. The collar prevents or reduces leakage from the node junction to the buried plate. In one embodiment, the collar is about 1.2 $\mu m$ deep and 20–90 $\mu m$ thick.

An STI 380 is provided in a top portion of the trench to isolate the DRAM cell from other cells in the array and to prevent strap formation between adjacent capacitors. As shown, the STI overlaps a portion of the trench, leaving a remaining portion to permit current to flow between the transistor and capacitor. In one embodiment, the STI nominally overlaps about half the trench width. The STI prevents or reduces strap to strap leakage. The depth of the STI is about 0.25 µm.

The transistor 310 comprises a gate stack 312 and drain/source diffusion regions 313 and 314. The diffusion regions comprise n-type dopants, such as As or P. Diffusion region 314 is coupled to the node junction 325. The gate stack, also referred to as the "wordline," comprises poly layer 315. Typically, the poly is doped with either n or p-type dopants. Optionally, a metal silicide layer (not shown) is formed over the poly layer to reduce sheet resistance of the gate stack. The poly and suicide are sometimes referred to as "polycide."

As shown, the gate stack is capped with a nitride layer 316 that is used as an etch mask for isolating the wordline. Additionally, sidewall oxide (not shown) and a liner 317 are used to isolate the wordline. The liner, for example, comprises nitride or other suitable material. The liner also serves as an etch stop during the formation of a borderless contact 383. The borderless contact provides a connection between diffusion 313 and a bitline 385. A dielectric layer 389, such as BPSG or other dielectric materials such as oxide, isolates the bitline from the diffusion regions. A liner (not shown) may be provided to isolate the contact from the gate.

A passing wordline 320 is formed above a STI 380. The passing wordline is isolated from the trench by the STI and a thick cap oxide. In one embodiment, the edges of the passing wordline are substantially aligned with the trench sidewalls. Such configuration is referred to as a folded bitline architecture. Other configurations such as, for example, open or open-folded architecture are also useful.

As described, the first electrical type is p-type and the second electrical type is n-type. The invention is also applicable to trench capacitors having p-type poly formed in an n-type substrate. Further, it is possible to heavily or lightly dope the substrate, wells, buried plate, and other elements of the DRAM cell with impurity atoms to achieve the desired electrical characteristics.

Although, The first electrical type is p-type and the second electrical is n-type, forming the DRAM cell in a n-type substrate with p-type poly filled trench is also useful. Further, it is possible to heavily or lightly dope the substrate, wells, buried plate, and other elements of the DRAM cell with impurity atoms to achieve the desired electrical characteristics. Additionally, the use of a vertical transistor or other types of cell layouts is also useful.

Figure 4A:
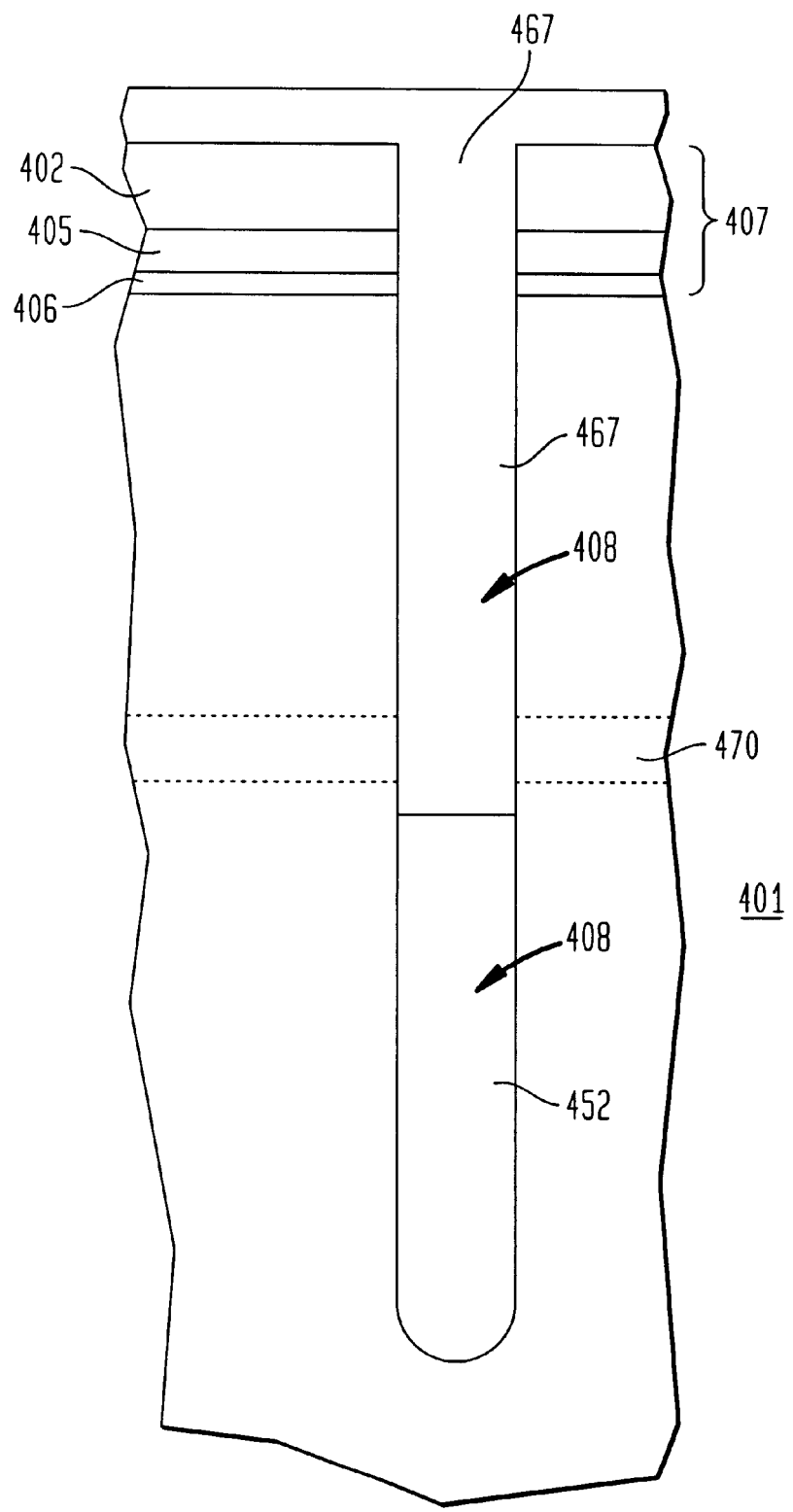

FIGS. 4A–4G show a process for forming the DRAM cell in accordance with the invention. Referring to FIG. 4A, a substrate 401 is provided on which the DRAM cell is fabricated. The major surface of the substrate is not critical and any suitable orientation such as a (100), (110), or (111) is useful. In an exemplary embodiment, the substrate is lightly doped with p-type dopants ($p^{31}$), such as B. The concentration of the B is about $1-2 \times 10^{16}$ cm$^{31\ 3}$.

The substrate also includes a n-type buried well 470. The buried well comprises P or As dopants. In one embodiment, a mask is patterned to define the buried well regions. N-type dopants are then implanted into buried well regions of the substrate. The buried well serves to isolate the p-well 451 from the substrate and also forms a conductive bridge between the buried plates of the capacitors. The concentration and energy of the implant is about $>1 \times 10^{13}$ cm$^{-2}$ at about 1.5 MeV. Alternatively, the buried well is formed by implanting and then growing an epi layer above the substrate surface. Such technique is described in U.S. Pat. No. 5,250,829 to Bronner et al., which is herein incorporated by reference for all purposes.

Typically, a pad stack 407 is formed on the surface of the substrate. The pad stack comprises, for example, a pad oxide layer 404 and a stop layer 405. The stop layer, which serves as a polish or etch stop for subsequent processes, comprises for example nitride. Above the stop layer is a hard mask layer 406. The hard mask comprises TEOS. Other materials such as BSG are also useful to serve as the hard mask layer. Additionally, an anti-reflective coating (ARC) may be used to improve the lithographic resolution.

The hard mask layer is patterned using conventional lithographic techniques to define a region in which the trench is to be formed. This includes depositing a layer of resist and selectively exposing it with the desired pattern. The resist is then developed and either the exposed or unexposed portions are removed, depending on whether a positive or negative resist is used. The exposed portions of the pad stack are then etched to the surface of the substrate. A reactive ion etch (RIE) then forms a deep trench 408.

A semiconductor layer 452 is deposited on the wafer, filling the trench. The semiconductor layer comprises, for example, silicon. In one embodiment, the semiconductor layer comprises poly. Amorphous silicon is also useful. Other types of material which has a temperature stability up to about 1050–1100° C. and can be removed selective to nitride or oxide is also useful. The poly layer 315 is referred to as a sacrificial poly layer since it is subsequently removed. Typically, a native oxide is formed, lining the trench sidewall before the trench is filled with poly. The oxide layer is typically about, for example, 0.3–1 nm thick. The poly is then recessed to about the bottom of the collar. Recessing the poly includes, for example, planarizing it by CMP, chemical dry etch (CDE), or RIE to form a co-planar surface with the top of the poly in the trench and the top of the pad stack. A RIE is performed to recess the poly in the trench. The use of a CDE to recess the poly is also useful. Preferably, the poly is planarized and recessed by a CDE or RIE in a single step.

A dielectric layer 467 is then deposited over the wafer, covering the pad stack and trench sidewalls. The dielectric layer is used to form the collar. The dielectric layer comprises, for example, oxide. In one embodiment, the dielectric layer is formed by first growing a layer of thermal oxide and then depositing an oxide layer by chemical vapor deposition (CVD) such as plasma enhanced CVD (PECVD) or low pressure CVD (LPCVD) using TEOS. The CVD oxide may be densified by an anneal. The oxide layer is sufficiently thick to prevent vertical leakage. Typically, the layer is about 10–50 nm thick. Alternatively, the dielectric layer comprises a layer of thermal oxide.

In another embodiment, the dielectric layer is formed from CVD oxide. After formation of the CVD oxide, an anneal may be performed to densify the oxide. The anneal is performed in, for example, Ar, $N_2$, $O_2$, $H_2O$, $N_2O$, NO, or $NH_3$ ambient. An oxidizing ambient such as $O_2$ or $H_2O$ amy be used to form an thermal oxide layer beneath the CVD oxide. Oxygen from the ambient diffuses through the CVD oxide to form a thermal oxide layer on the substrate surface. This advantageously enables the formation of a thermal oxide, if desired, without needing a thermal oxidation step prior to the deposition of the CVD oxide. Typically, the anneal is performed at a temperature of about 1000–1100° C. for about 0.5–3 hours.

Figure 4B:
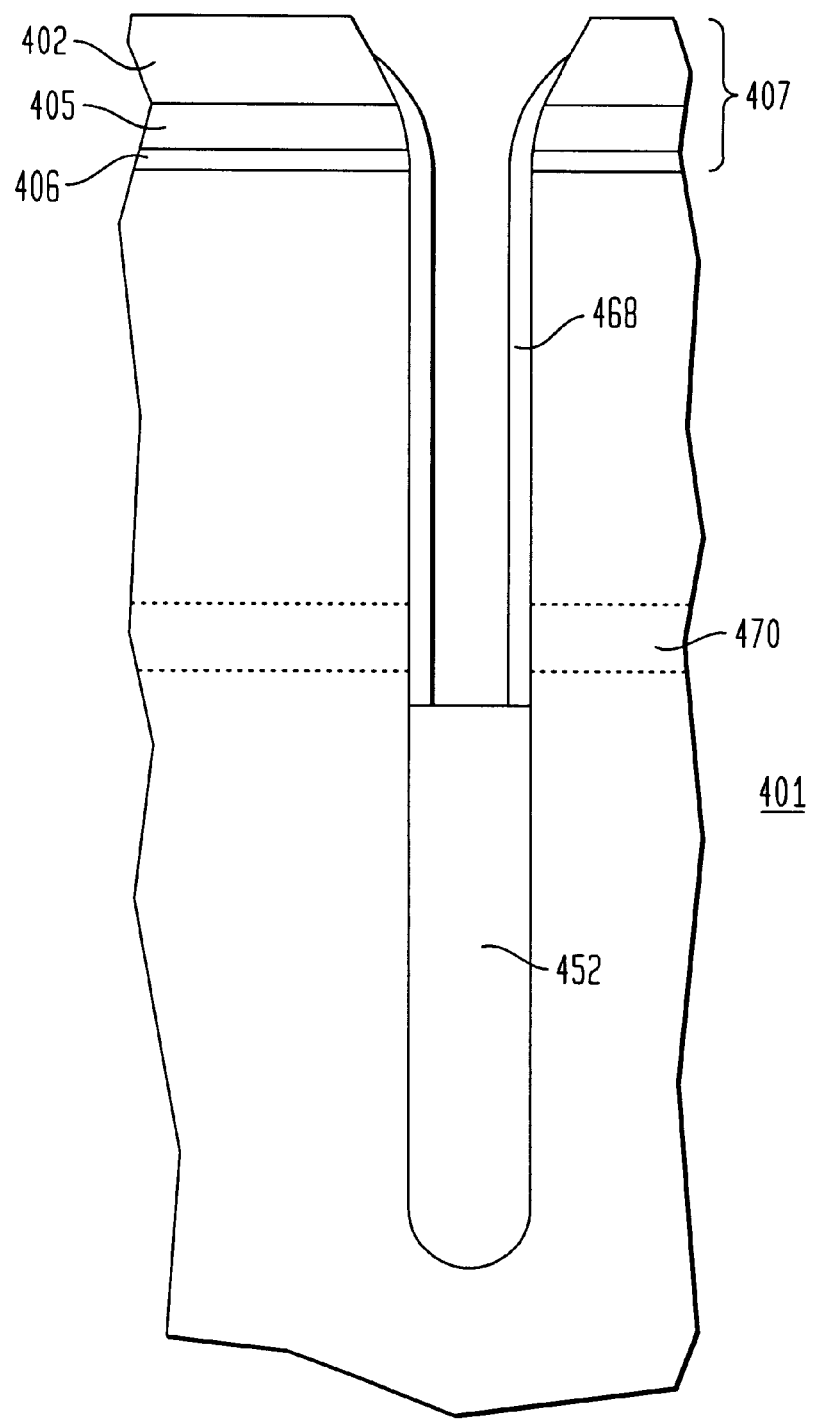

Referring to FIG. 4B, the dielectric layer 467 (FIG. 4A) is etched by, for example, RIE to open the collar. The collar open RIE chemistry is chosen to etch oxide selective to poly and nitride. The RIE removes the dielectric layer from the surface of the pad stack and the bottom of the opening. The dielectric layer remains on the silicon sidewall, forming a collar 468. As depicted, the top portion of collar is slightly eroded, forming to a taper top portion.

Figure 4C:
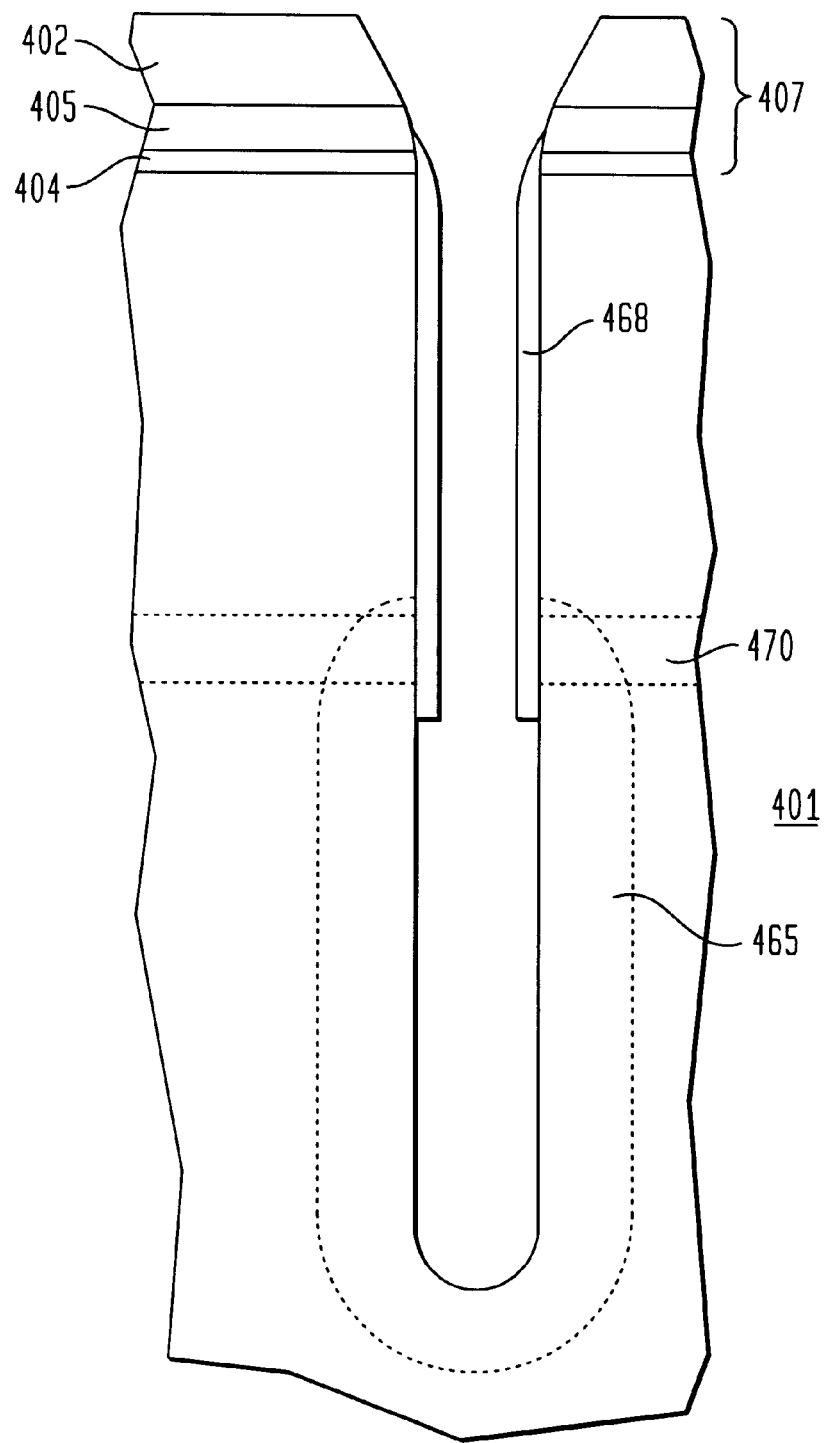

Referring to FIG. 4C, the sacrificial poly layer is removed from the bottom of the trench. Removal of the sacrificial poly is achieved preferably by CDE. A thin native oxide layer is typically present on the exposed trench sidewalls. This native oxide may be sufficient to serve as a CDE etch stop. A CDE using, for example, $NF_3+Cl_2$ chemistry can etch silicon or poly with relatively high selectivity to oxide, enabling the removal of the poly using the thin native oxide layer as an etch stop. For example, a selectivity of about 4000:1 has been found to be effective in removing the poly from the trench using the native oxide as an etch stop layer.

In one embodiment, a CDE with high $Cl_2$ is employed to increase the silicon or poly etch selectivity to oxide. A flow rate of about 12 sccm results in effectively zero oxide etch rate while the poly etch rate is in the order of about 2 $\mu$m/min. This enables the native oxide layer to serve as an effective etch stop for the removal of the sacrificial poly. Typically, the thickness of native oxide should be about 1 nm and more preferably about 1.5 nm.

Alternatively, a wet etch employing, for example, KOH or HF:HNO3:CH3COOH is also useful in removing the poly. However, the use of KOH can lead to K contamination on the trench sidewall, which may require an additional clean step. A RIE is also useful in removing the poly, since it is anisotropic. Suitable chemistry for the RIE removal of the poly includes $SF_6$. Other appropriate chemistry that etches poly selective to oxide or nitride such as $NF_3$/HBr is also useful. The RIE etch selectivity of poly to oxide or nitride is about less than 100:1 on planar surfaces but increases to greater than about 2000:1 on vertical surfaces due to the predominantly vertical direction of the motion of the ions during RIE etch. Due to the high selectivity of poly to oxide or nitride on the vertical surfaces, only the upper portion of the collar is eroded. However, this is not a problem since the collar is not eroded below the surface of the substrate.

After removal of the poly, a buried plate 465 comprising of n-typed dopants such as As or P is optionally formed to serve as the second electrode. The collar serves as an isolation mask, allowing only the region below the collar to be doped. The concentration of the dopants is about $1\times10^{19}$–$10^{20}$ cm$^{-3}$. To form the buried plate, gas phase doping using $PH_3$ or $AsH_3$, plasma doping, or plasma immersion ion implantation (PIII) is employed. Such techniques are described in, for example, Ransom et al., J. Electrochemical. Soc. Vol. 141, No. 5 (1994) pp. 1378; U.S. Pat. No. 5,344,381; U.S. Pat. No. 4,937,205; and copending U.S. patent application Ser. No. 09/031,995, titled IMPROVED TECHNIQUES FOR FORMING TRENCH CAPACITORS IN AN INTEGRATED CIRCUIT filed on Feb. 27, 1998, which are herein incorporated by reference for all purposes. Ion implantation using the collar as an isolation mask is also useful. Alternatively, the buried plate is formed using a doped silicate glass such as ASG as a dopant source. The use of doped silicate glass as a dopant source is described in Becker et al., J Electrochemical. Soc. Vol. 136 (1989) pp. 3033, which is herein incorporated by reference for all purposes. When doped silicate glass is employed, the layer is removed after the formation of the buried plate.

Figure 4D:
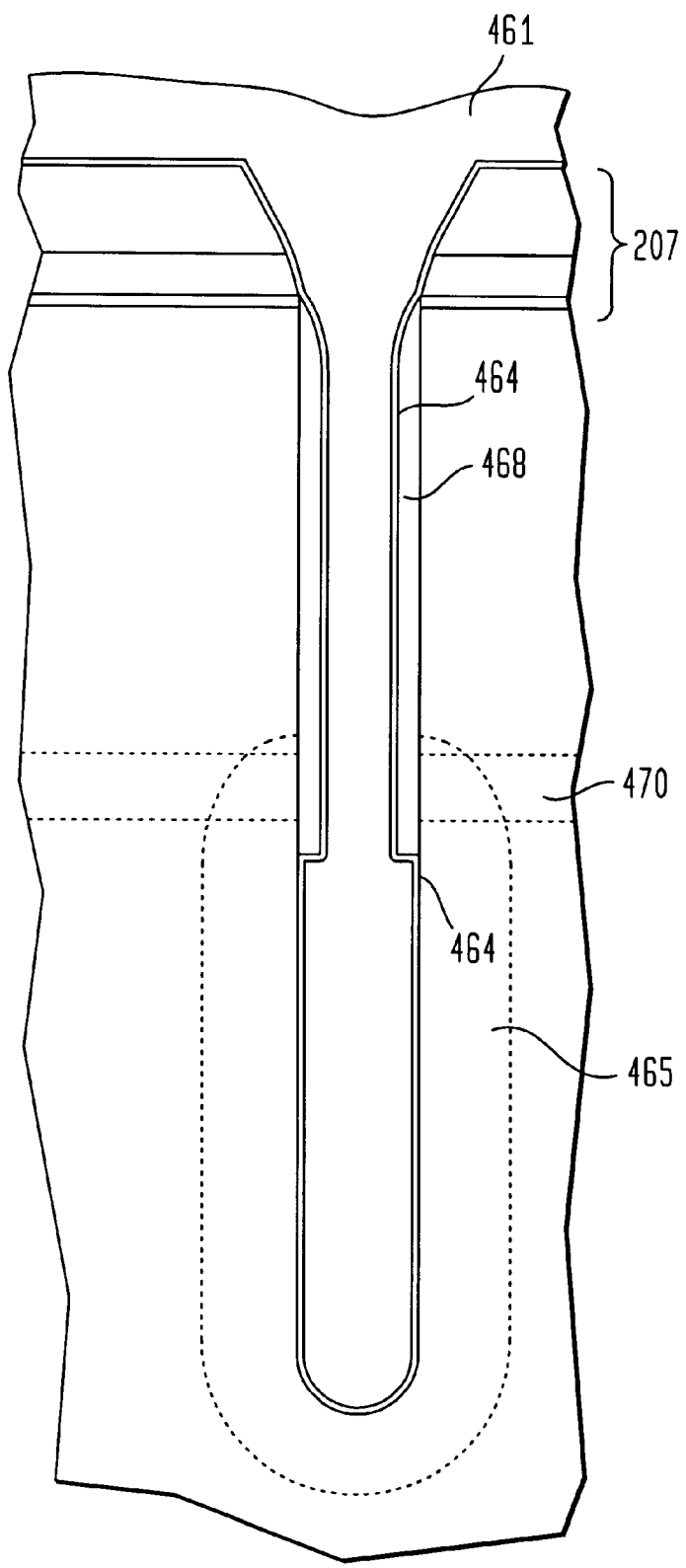

Referring to FIG. 4D, a node dielectric layer 464 is deposited on the wafer, covering the surface of the pad stack and the interior of the trench. The dielectric layer serves as the node dielectric used to separate the plates of the capacitor. In one embodiment, the dielectric layer comprises a NO film stack. The NO film stack is formed by depositing a nitride layer which is then reoxidized. The nitride layer is formed by, for example, thermal nitridation and CVD nitride in an FTP tool to a thickness of about 6.5 nm. The nitride layer is reoxidized at, for example, a temperature of about 900° C. The re-oxidation of the nitride layer increases the thickness of the nitride marginally. Other types of dielectric film stacks, such as oxide-nitride-oxide (ONO) or oxide-nitride-oxide-nitride (ONON), are also useful. Also, the use of a thin oxide, nitride, or nitrided oxide film is also useful.

A poly layer 461 is deposited on the surface of the wafer, filling the trench and covering the pad stack. The poly is deposited by, for example, CVD or other known techniques. As shown, the poly layer is conformal. The poly is doped with n-type dopants, such as P and As. In one embodiment, the layer is doped with As. The concentration of As is about $1\times10^{19}$–$1\times10^{20}$ cm$^{-3}$. The trench is filled with poly doped with As. The doped poly serves as an electrode (or node electrode) of the capacitor. Alternatively, the layer comprises amorphous silicon. The material can either be in-situ doped or sequentially doped.

Figure 4E:
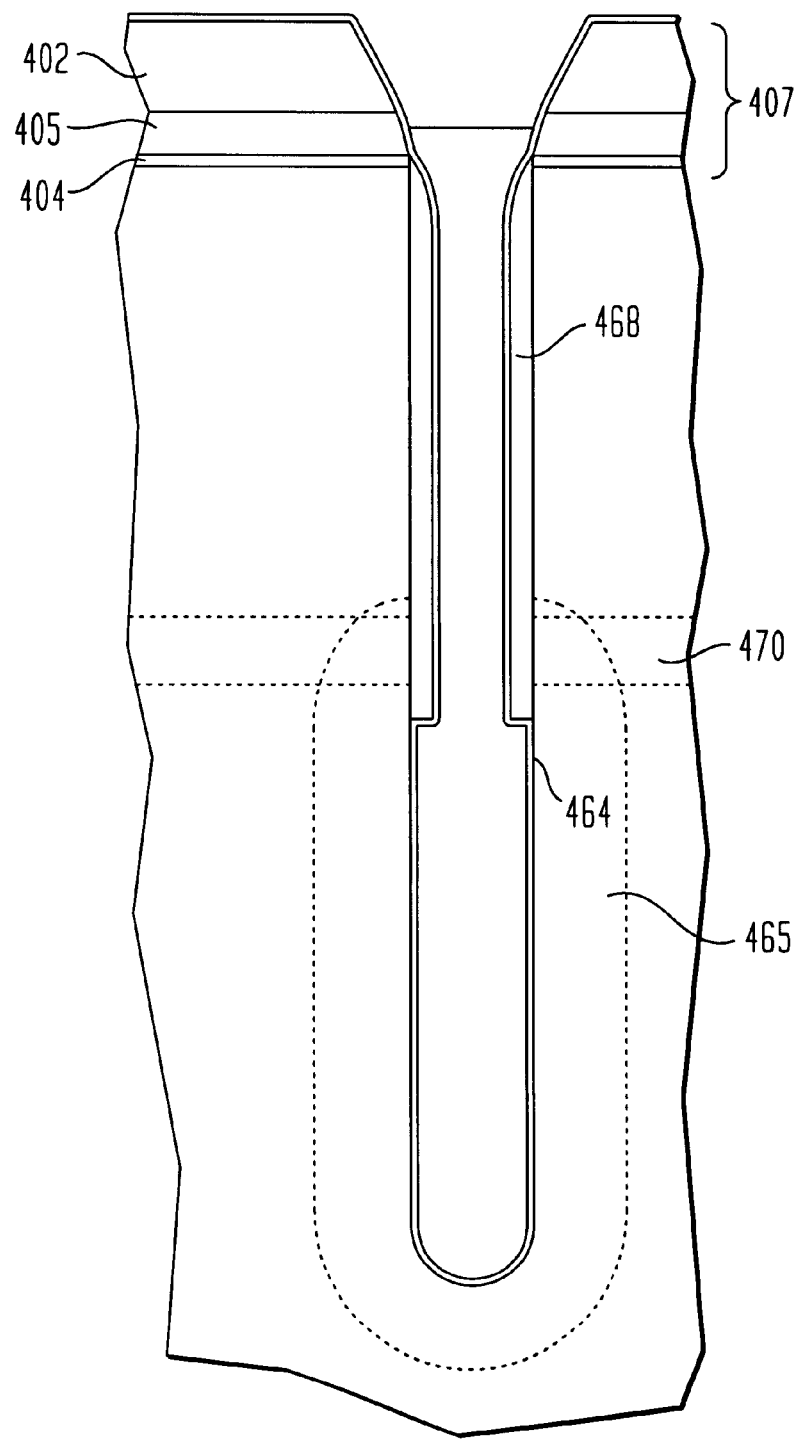

Referring to FIG. 4E, the poly layer 461 is recessed by, for example, CDE or RIE using suitable chemistries such as $NF_{3/Cl2}$, or $NF_3$/HBr, or $SF_6$. In one embodiment, the poly is recessed to about the level of the pad nitride. This advantageously protects the pad oxide from undercut during subsequent wet etch processes. If undercut is not a problem, the poly can be recessed to the depth of the buried strap.

Figure 4F:
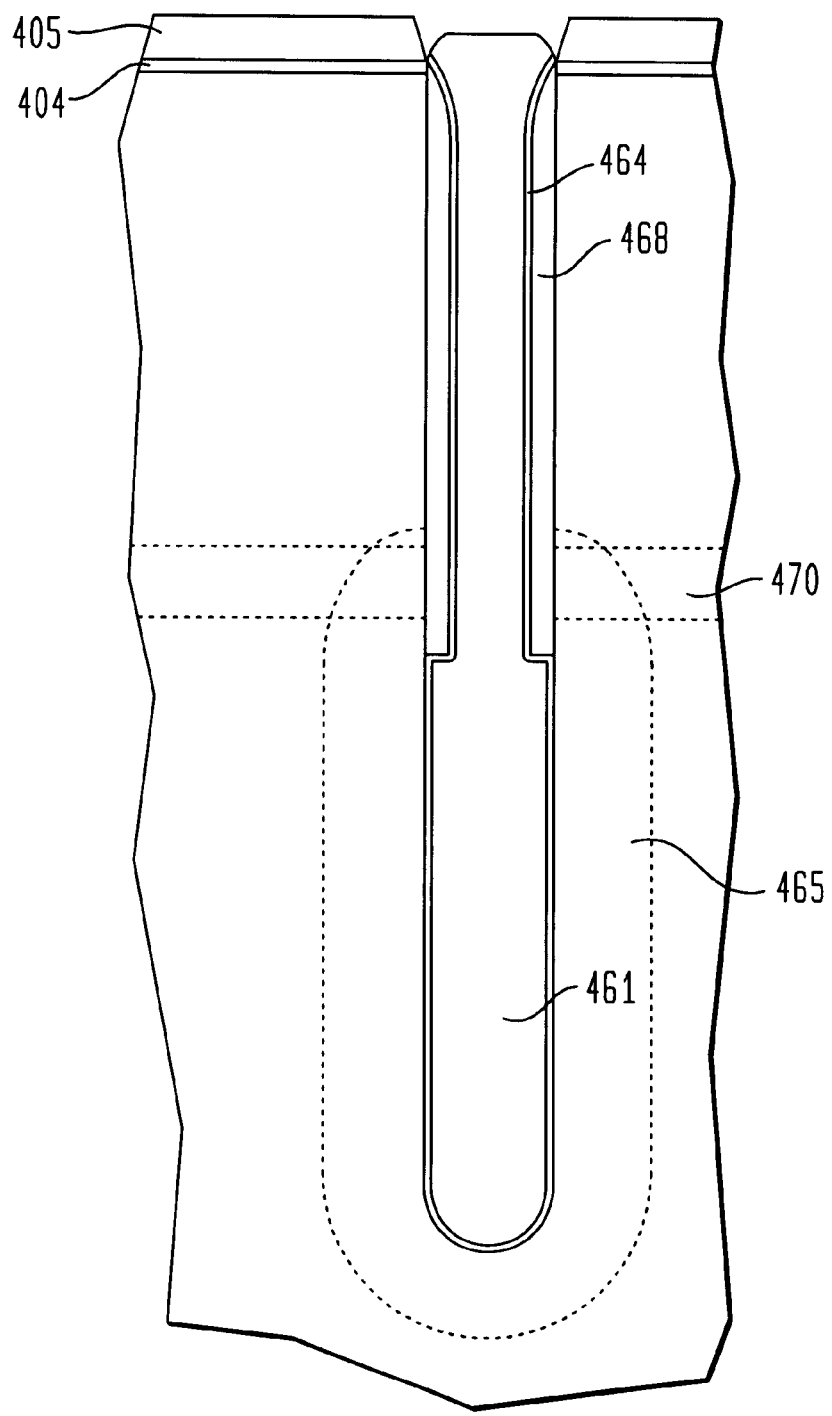

In FIG. 4F, the residual node dielectric layer above the poly is removed by a wet etch with, for example, DHF and HF/Glycerol. The mask layer is then stripped by a wet etch using, for example, BHF. The use of CDE to remove the hard mask is also useful. In some embodiments, the hard mask layer is removed earlier on in the process flow, such as after formation of the deep trench. As shown, the collar and dielectric layer in the trench are slightly recessed as well.

Figure 4G:
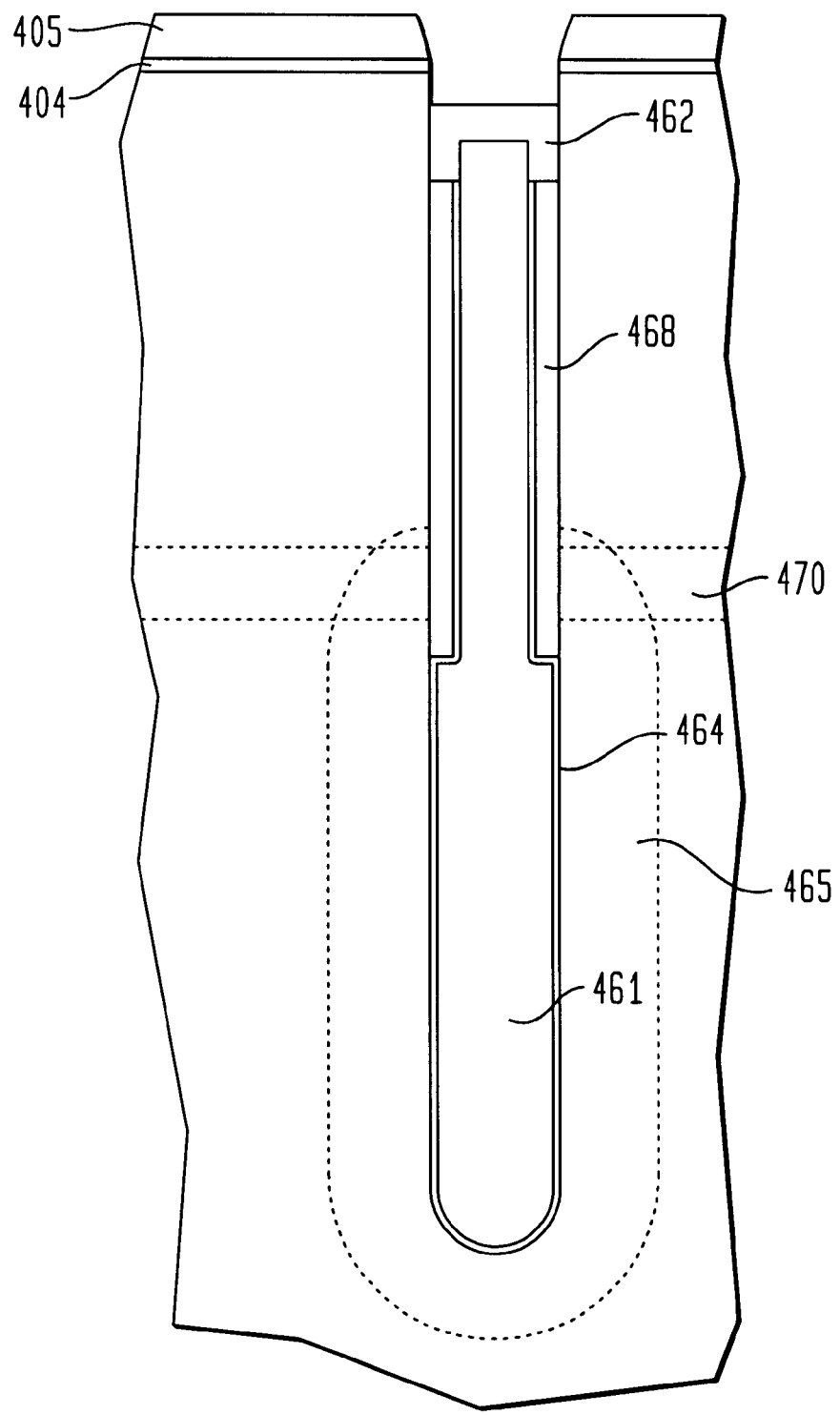

In one embodiment, as shown in FIG. 4G, a buried strap 462 is formed. Formation of the buried strap is achieved by, for example, an etch to recess the doped poly 415 in the trench. Typically, the etch is an RIE. The poly is recessed to a depth sufficient to form the buried strap. In one embodiment, the poly is recessed to about 0.10 $\mu$m below the silicon surface. The collar and node dielectric are then recessed by a wet etch to below the top surface of the doped poly. BHF or other oxide etch chemistry is useful for the wet etch. A CDE can also be used. Typically, the collar oxide is recessed about 50 nm below the top of the recessed poly. The wet etch also recesses the node dielectric. However, etch recesses the node dielectric less than the collar oxide. This results in a smaller buried strap opening. An additional nitride etch using, for example, HF/Glycerol chemistry may be employed to increase the buried strap opening. Increasing the buried strap opening advantageously decreases buried strap resistance. The depth of the recesses, of course depends on design requirements of the buried strap.

A poly layer is deposited on the substrate, covering the nitride layer and top portion of the trench. The use of amorphous silicon is also useful. Typically, the deposited layer is undoped. The layer is planarized down to the nitride stop layer 405. After planarization, the poly in the trench is recessed to, for example, about 0.05 $\mu$m below the surface of the substrate, leaving a buried strap 462 of about 0.10 $\mu$m thick above the doped poly 420. Planarizing and recessing the layer using a single RIE or CDE step is also useful.

Figure 4H:
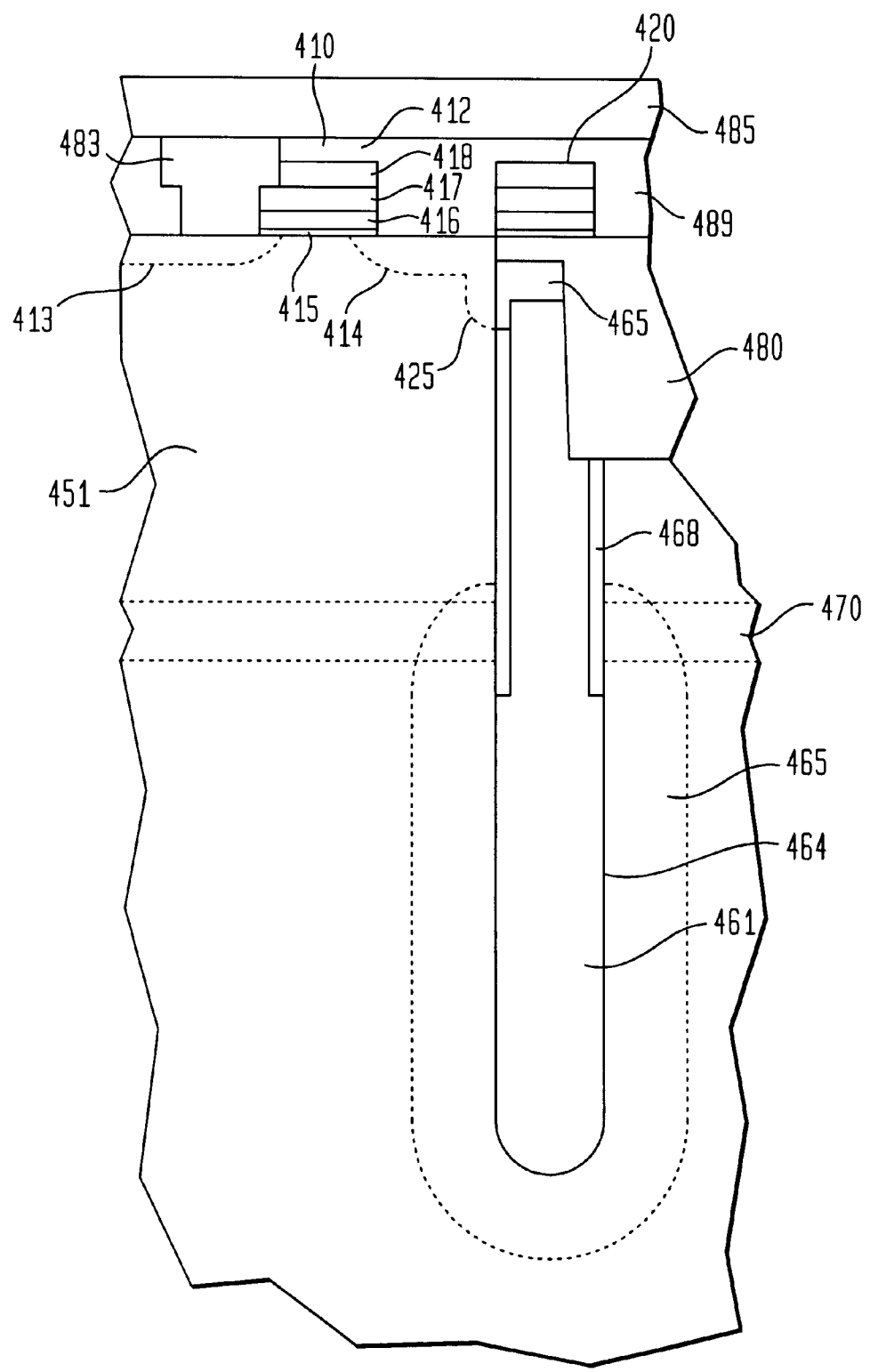

Referring to FIG. 4H, the active area (AA) of the DRAM cell is defined. An anti-reflective coating (ARC) layer is deposited on the substrate surface, covering the nitride stop layer and buried strap. The ARC is used to improve the resolution of the lithographic process for defining the AA. A resist layer is formed above the ARC layer, serving as an AA etch mask. The active region is then defined by conventional lithographic technique. The non-active region of the cell is then anisotropically etched by, for example, RIE. The non-active region is the region where a STI 480 is to be formed.

As shown, the STI overlaps a portion of the trench, cutting off part of the strap 440. In a subsequent anneal, dopants from the doped poly diffuse upward and outward through the strap to form diffusion region 425. The depth of the STI is about 0.25 $\mu$m. Typically, the non-active region is etched below the top of the oxide collar. In one embodiment, the non-active region is etched about 0.25 $\mu$m below the substrate surface.

After the non-active region is etched, the resist and ARC layers are removed. To ensure that no resist or ARC residues remain, clean steps may be employed. To prevent oxygen from diffusing into the silicon and poly sidewalls, a liner (not shown) is provided to protect the non-active region. The liner comprises, for example, nitride Typically, a passivation oxide is thermally grown on the exposed silicon prior to forming the nitride liner. The nitride liner is formed by, for example low pressure chemical vapor deposition (LPCVD). The nitride liner is formed over the substrate surface, covering the nitride layer and non-active STI region.

A dielectric material is formed on the surface of the substrate. The dielectric material, for example, comprises $SiO_2$. In one embodiment, the dielectric material is TEOS. High density plasma (HDP) oxide or other suitable isolation material is also useful. The thickness of the dielectric layer is sufficient to fill the non-active region. Since the dielectric layer is typically conformal, planarization schemes such as CMP are employed. Such schemes are described in Nesbit et al., *A 0.6 $\mu m^2$ 256 Mb Trench DRAM Cell With Self-Aligned Buried Strap (BEST)*, IEDM 93–627; which is already herein incorporated by reference for all purposes. The surface of the substrate is polished so that the STI and nitride layer are substantially planar.

The pad stop layer is then removed by, for example, wet chemical etch. The wet chemical etch is selective to oxide. The pad oxide is also removed at this point by wet chemical etch selective to silicon. After removal of the pad oxide, an oxide layer is formed on the surface of the wafer. The oxide layer, referred to as a "gate sacrificial layer", serves as a screen oxide for subsequent implants.

To define a region for a p-type well 451 for the n-channel access transistor 410 of the DRAM cell, a resist layer is deposited on top of the oxide layer and appropriately patterned to expose the p-well region. As shown, p-type dopants, such as boron (B) are implanted into the well region. The dopants are implanted sufficiently deep to prevent punchthrough and to reduce sheet resistance. The dopant profile is tailored to achieve the desired electrical characteristics, e.g., gate threshold voltage ($V_t$).

In addition, p-type wells for n-channel support circuitry are also formed. For complimentary wells in complimentary metal oxide silicon (CMOS) devices, n-wells are formed. Formation of n-type wells require additional lithographic and implant steps for defining and forming the n-type wells. As with the p-type wells, the profile of the n-type wells are tailored to achieve the desired electrical characteristics. After the wells have been formed, the gate sacrificial layer is removed.

The various layers for forming a gate of a transistor are formed. This includes forming a gate oxidation layer 415 that serves as a gate oxide, a poly layer 416, and a cap nitride layer 418. Typically, the poly layer may include a metal silicide layer 417 such as $WSi_x$, forming a polycide to reduce sheet resistance. The various gate layers are then patterned to form a gate stack 412 of transistor 410. A passing gate stack 420 is typically formed over the trench and isolated therefrom by the STI. Source/drain diffusion regions 413 and 414 are formed by implanting n-type dopants such as P or As. In one embodiment, P is implanted into the source and drain regions. The dose and energy is chosen to produce a dopant profile which achieves the desired operating characteristics. To improve diffusion and alignment of the source and drain to the gate, nitride spacers (not shown) may be employed. The diffusion region 414 connects to diffusion region 425, forming the node junction.

A dielectric layer 489 is formed over the wafer surface, covering the gates and substrate surface. The dielectric layer, for example, comprises BPSG. Other dielectric layers, such as TEOS, are also useful. As shown, a borderless contact opening 483 is etched to expose the diffusion region 413. The contact opening is then filled with a conductive material, such as n+ doped polysilicon, forming a contact stud therein. A metal layer 485, representing a bitline, is formed over the dielectric layer, making contact with the source via the contact stud.

FIG. 5 shows an alternative embodiment of the invention. As shown, the width $W_2$ or diameter of the lower portion of a trench capacitor is greater than $W_1$ of the upper portion. Increasing the $W_2$ increases the capacitance of the capacitor. To achieve such a structure, the sacrificial poly is cleared as described in FIG. 4B by CDE using, for example, $NF_3/Cl_2$ chemistry. Other chemistries for etching silicon selectively are also useful. Additionally an RIE using $SF_6$, $NF_3/HBr$, or a wet etch using KOH chemistry is useful. The bottom part of the trench is expanded by, for example, a CDE etch. Expansion of the trench is described in, for example, T. Ozaki et al., "0.228 $um^2$ Trench Cell Technologies with Bottle-shaped Capacitor for 1 Gigabit DRAMs", which is herein incorporated by reference for all purposes. The etchant for the CDE etch is selected to also remove the thin native oxide on the trench sidewalls. This can be achieved by reducing the flow rate of $Cl_2$ to decrease the selectivity of the etch to oxide, or by changing the chemistry.

The wet etch or CDE is timed so as to remove the sacrificial poly while limiting the expansion from extending into or contacting adjacent trenches. The expansion of the bottom portion of the trench is less than about 50% of the minimum spacing between adjacent trenches, preferably less than 20–30% of the minimum spacing between adjacent trenches. Since the spacing between adjacent trenches is typically equal to about minimum groundrule (GR), the expansion should be limited to less than 50% of the GR. This would provide for example, a bottle shape trench whose lower diameter is less than 2GR. Preferably, the expansion of the trench is about 20 –40% of the GR.

After removing the sacrificial poly and the etch stop layer, a buried plate can optionally be formed. Various techniques for forming the buried plate, such as gas phase doping with for example, $AsH_3$ or $PH_3$ at temperatures of about 1000–1100° C., ion implantation of As or P, plasma doping, or plasma immersion ion implantation, are useful. Doped poly is then deposited to form the node electrode. The doped poly, as it fills the lower portion of the trench, form a void 572 therein. Since the void is located in the lower portion of the trench, it does not impact subsequent processing or device functionality. Other techniques to enhance trench capacitance such as forming hemispherical silicon grain (HSG) in the trench or roughening the trench sidewalls prior to node dielectric deposition are also useful.

FIGS. 6A–6C show a portion of an alternative process for forming the DRAM cell in accordance with the invention. Referring to FIG. 6A, a substrate 601 is provided. As shown, the substrate includes a n-type buried well 670. A pad stack 407, which includes for example a pad oxide layer 404, a polish stop layer 405, and a hard mask layer 406, is formed on the surface of the substrate. The pad stack is patterned to define a trench region 602 and a deep trench 608 is formed therein by RIE.

After formation of the trench, an etch stop layer 676 is deposited on the trench sidewalls. The etch stop layer is particularly useful if the native oxide layer on the trench sidewalls is too thin (about <1 nm) to sufficiently serve as an etch stop. The etch stop layer covers the pad stack and lines the trench sidewall. In one embodiment, the etch stop layer comprises a material which poly can be removed selective thereto. The thickness of the etch stop layer is sufficient of enable a subsequently deposited sacrificial material 615 to be removed from the trench virtually without expanding the sidewalls to avoid a bottle shaped trench. The actual thickness that is required is optimized depending on the process condition of the etch used to remove the sacrificial poly. Typically, the thickness of the layer is about 1 –20 nm, preferably about 1–5 nm.

In one embodiment, the etch stop layer comprises a dielectric material such as oxide, nitride, or oxynitride formed by various techniques, such as thermal growth or CVD. Preferably, the etch stop layer comprises oxide. The use of oxide advantageously avoids the need to remove the upper portion prior to the formation of the collar or removing the lower portion after removal of the sacrificial poly.

A sacrificial poly layer 652 is deposited over the wafer, filling the trench 608. The sacrificial poly is recessed, removing it from the upper portion of the trench. The poly is recessed to about the bottom of the collar. Optionally, the exposed portion etch stop layer in the upper portion of the trench is removed using, for example, a wet etch comprising DHF chemistry. A collar layer 667 is then formed, covering the upper portion of the trench sidewalls and the top of the sacrificial poly. The dielectric layer, which serves as the collar oxide, comprises typically a thin thermal oxide under a CVD oxide. Optionally, an anneal can be performed to densify the collar layer. Alternatively, the collar oxide is formed by depositing a CVD oxide and densifying it in an oxidizing ambient. This facilitates the formation of a thermal oxide layer at the trench/CVD oxide interface, improving collar reliability.

Referring to FIG. 6B, the collar layer is etched by RIE to form collar 668. The sacrificial poly 651 is then removed with an RIE or CDE. A wet etch is also useful in removing the sacrificial material. The oxide etch stop layer prevents the etch from expanding the trench sidewalls during removal of the sacrificial poly. Referring to FIG. 6C, the oxide etch stop layer is then removed. A buried plate 665 is then formed using techniques previously discussed. A dielectric layer 664 is deposited over the wafer, covering the collar and trench sidewalls in the lower portion of the trench. The dielectric layer serves as the node dielectric of the trench capacitor. A doped poly layer 661 is then deposited, filling the trench. The process for forming the trench capacitor and memory cell continues, as discussed from FIGS. 4D–4H.

FIGS. 7A–7C show an alternative embodiment of the invention. As shown, a pad stack 707 comprising, for example, a pad oxide layer 704, a stop layer 705, and a hard mask layer (not shown), is formed on the surface of the substrate. The pad stack is patterned to define a trench region. A RIE is performed to form a deep trench 708 in the trench region. A n-type buried well 670 is also provided in the substrate.

The hard mask layer is stripped after the formation of the trench, leaving the pad stop 705 and pad oxide 704 above the substrate surface. An etch stop layer 776 is formed to serve as an etch stop for the removal of a sacrificial poly 752 from the trench. After formation of the etch stop layer, the sacrificial poly 752 layer is deposited to fill the trench. The sacrificial poly is recessed to a desired depth, which is about the bottom of the collar. The exposed portion of the etch stop layer may be removed by, for example, a wet DHF etch or CDE. The removal of the exposed portion of the etch stop layer also removes the DT RIE damage and contamination, improving the reliability of the subsequently formed collar. A dielectric layer 767 is then deposited, covering the surface and sidewalls of the trench. The dielectric layer is used to form the collar. An anneal is performed to densify the dielectric layer. Alternatively, a CVD oxide is deposited and annealed in an oxidizing ambient to densify the CVD oxide and to form a thermal oxide beneath the CVD oxide in a single thermal processing step.

Referring to FIG. 7B, a RIE is performed to form the collar 768. After the RIE, the sacrificial poly and the etch stop layer are removed. Referring to FIG. 7C, a buried plate 765 is formed using techniques already described. A node dielectric 764 is formed. N-doped poly then fills the trench. At this point, the process continues as described from FIGS. 4C–4H.

Referring to FIG. 8, a DRAM cell in accordance with an alternative embodiment of the invention is shown. As shown, the DRAM cell includes a trench capacitor 860 coupled to a transistor 810. The trench capacitor 860, except for a buried plate that surrounds the lower portion of the trench, is similar to the trench capacitor 360 described in FIG. 3. Formation of the capacitor without a buried plate follows a similar process flow as those described in FIGS. 4, 6, and 7. However, the step of forming the buried plate, as described in for example FIGS. 4C, 6C, and 7C, is skipped. This means that after the removal of the sacrificial poly, a node dielectric is deposited instead of forming the buried plate.

In embodiments that employ an etch stop to prevent expansion of the lower portion of the trench, the node dielectric is formed after removal of the sacrificial poly and the etch stop layer. Additionally, the bottle shaped trench capacitor of FIG. 5 may also be formed without a buried plate by skipping the process for forming the buried plate. For example, the node dielectric is formed after removing the sacrificial poly and expanding the lower portion of the trench.

Referring now to FIGS. 9A–9E, here, after formation of the pad etch layer 905 and oxide layer 904, as described above in FIG. 2A for layers 205 and 204, respectively, an aperture 907 is formed through such layers using conventional lithographic-etching techniques to expose an underlying portion of the silicon substrate 910. A bottle-shaped trench 914 is formed in the exposed portion of the silicon substrate 910 using an initial reactive ion etching process to form the tapered upper neck portion 912 of the bottle, and adding an isotropic component (to the reactive ion etch process) to form the bottom portion 914 of the bottle. Here, the trench 914 has a minimum diameter in the upper portion 916 of the neck portion 912 of about 1.5 to 2 microns. The length, L, of the neck portion 912 is here about 1.7 microns.

Next, after formation of the bottle shaped trench 914, a thin, here about 1–5 nanometers thick, silicon dioxide layer 918 is grown, or deposited, on the walls of the trench 914, as indicated. This layer 918 has to be thin enough to allow diffusion of the dopants, e.g., As, P, Sb, from the sacrificial doped poly silicon, to be deposited and described in connection with FIG. 9B, to the bulk silicon substrate 910 and act later as an etch stop for removal of the sacrificial doped poly silicon removal, to be described in connection with FIG. 9D.

Figure 9A:
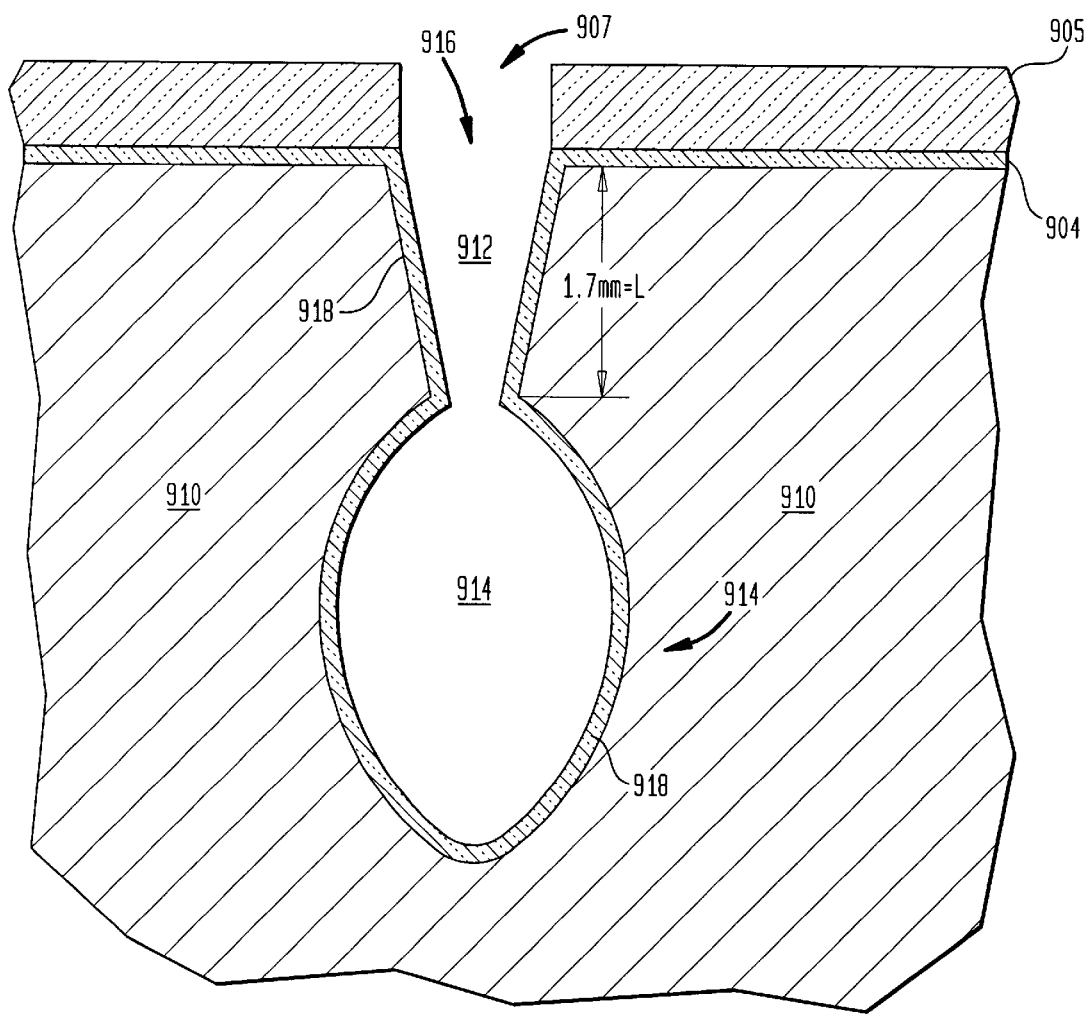
Figure 9B:
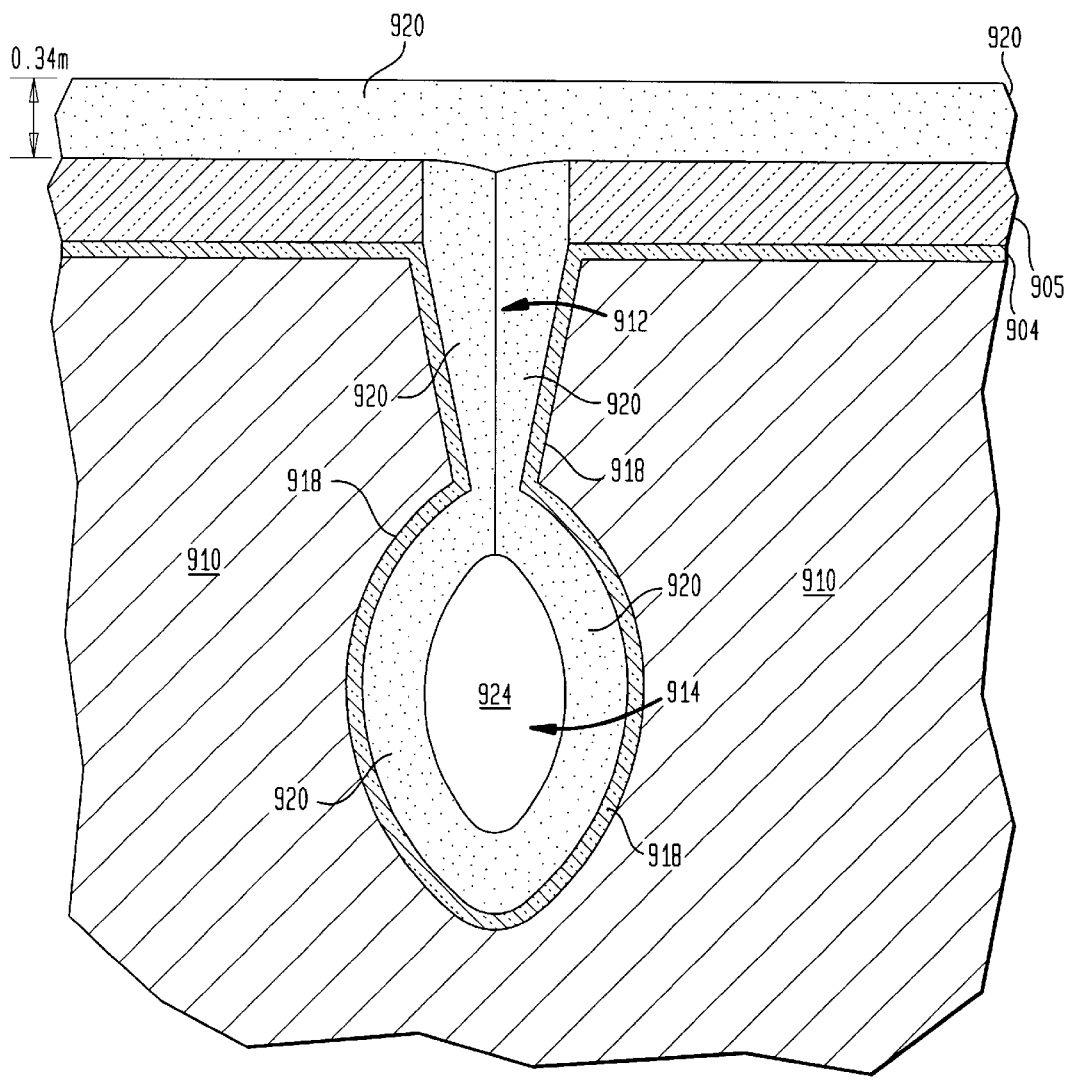

Next, referring to FIG. 9B, heavily doped polycrystalline silicon material 920 is deposited uniformly over the surface of the structure shown in FIG. 9A. This layer of polycrystalline is the sacrificial doped poly silicon described above in connection with FIG. 9A. The poly silicon material 920 is here doped with e.g., As, P, Sb and has a thickness of about 0.3 microns. The doping concentration is here $5 \times 10^{20}$ per $cm_3$. It is noted that the material fills the neck portion 912 of the bottle shaped trench 914 but leaves a void 912 in the lower portion of the trench 914, as indicated in FIG. 9B.

Figure 9C:
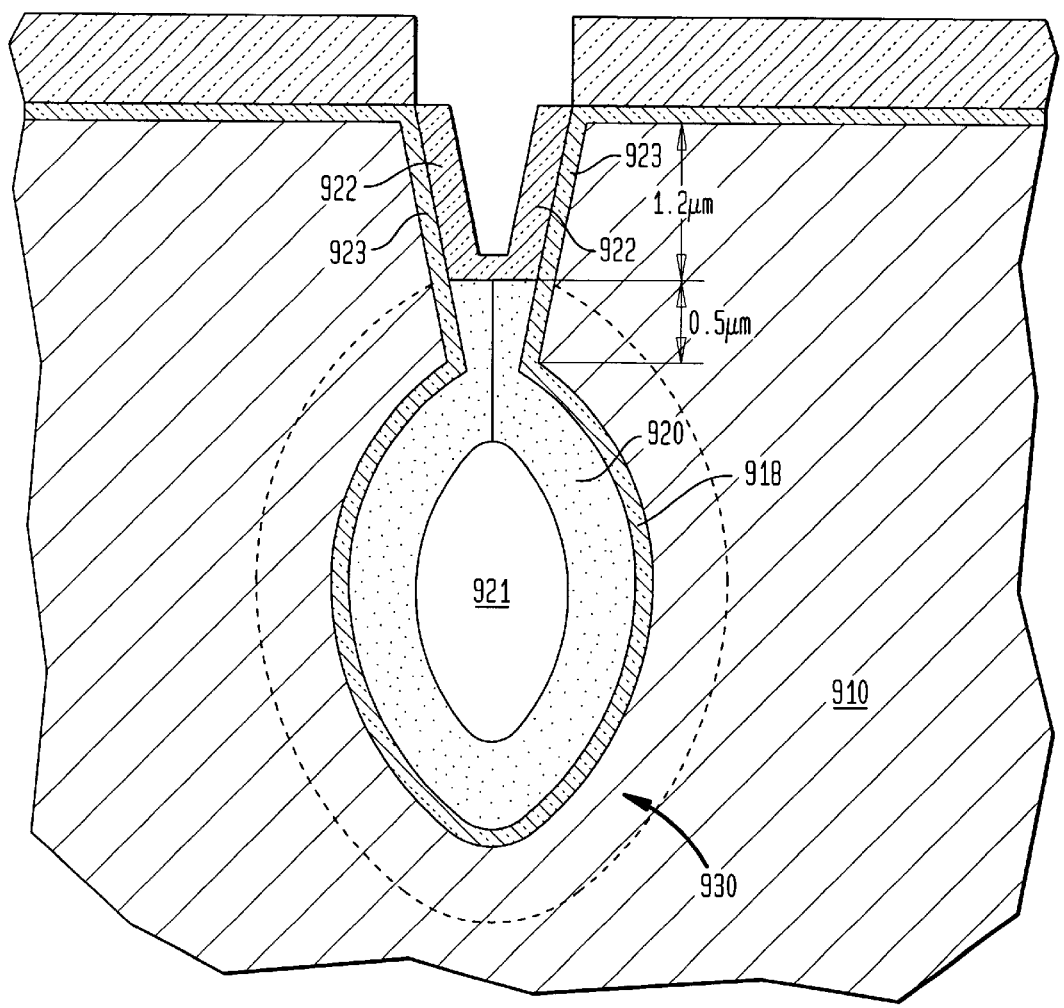

Next, the poly silicon material 920 is planarized and recessed for the formation of the dielectric collar 922, as shown in FIG. 9C. It is noted that the recessing of the poly silicon material 920 stops above the narrowest point of the neck portion 912 (FIG. 9B). Because the recessing is of the doped poly silicon material 920, the depth of the recess can be well controlled as distinguished from an oxide recess. Next, the dielectric collar 922 is formed. For example, a thermally grown silicon dioxide layer is formed and then a collar dielectric of TEOS or some other oxide/nitride collar material is deposited. Alternative collar formations are possible, for example, only a TEOS film can be deposited and the oxide can be grown during the later densification drive-in.

More particularly, after formation of the collar 922, a combined densification/drive-in anneal is performed (e.g., heating in a furnace at 1050 degrees Centigrade in an $Ar(O_2)$ enviroent for 30 minutes). This anneal leads to an out-diffusion of the dopants in the poly silicon material 920 through the thin oxide layer 918 into the silicon substrate 910 to form doped region 920 (i.e., the buried plate). It is noted that doping of the silicon substrate cover by the collar 922 does not occur because the collar bottom portion acts as a cap, or protection against such out diffusion. Thus, it is noted that simultaneously the collar material 922 is densified and, if combined with an oxygen containing atmosphere, the collar material 922 is also oxidized.

Figure 9D:
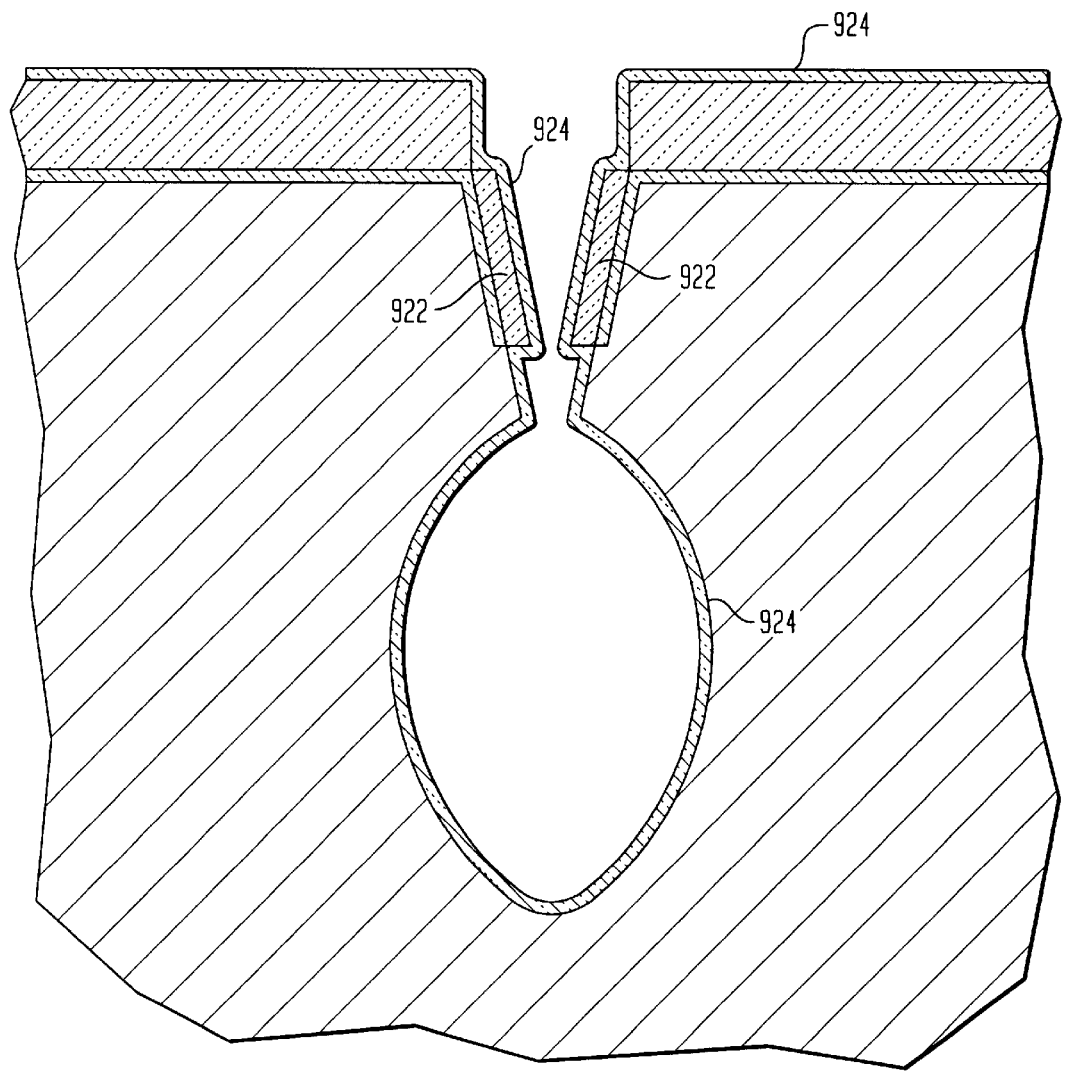

Next, referring to FIG. 9D, the bottom portion of the collar material 922 is removed using a reactive ion etching process. Once the bottom portion of the collar material 922 is removed, the sacrificial doped poly silicon material 920 is exposed. The exposed poly silicon material 920 is removed from the trench by CDE. It is noted that after the void 921 (FIG. 9C) is reached, only a thin layer of the poly silicon material 920 has to be removed to clear the trench. The oxide layer 918 (FIG. 9C) is removed by a short wet etch, such as HF. Next, the node dielectric layer 924 is deposited, as shown in FIG. 9D.

Figure 9E:
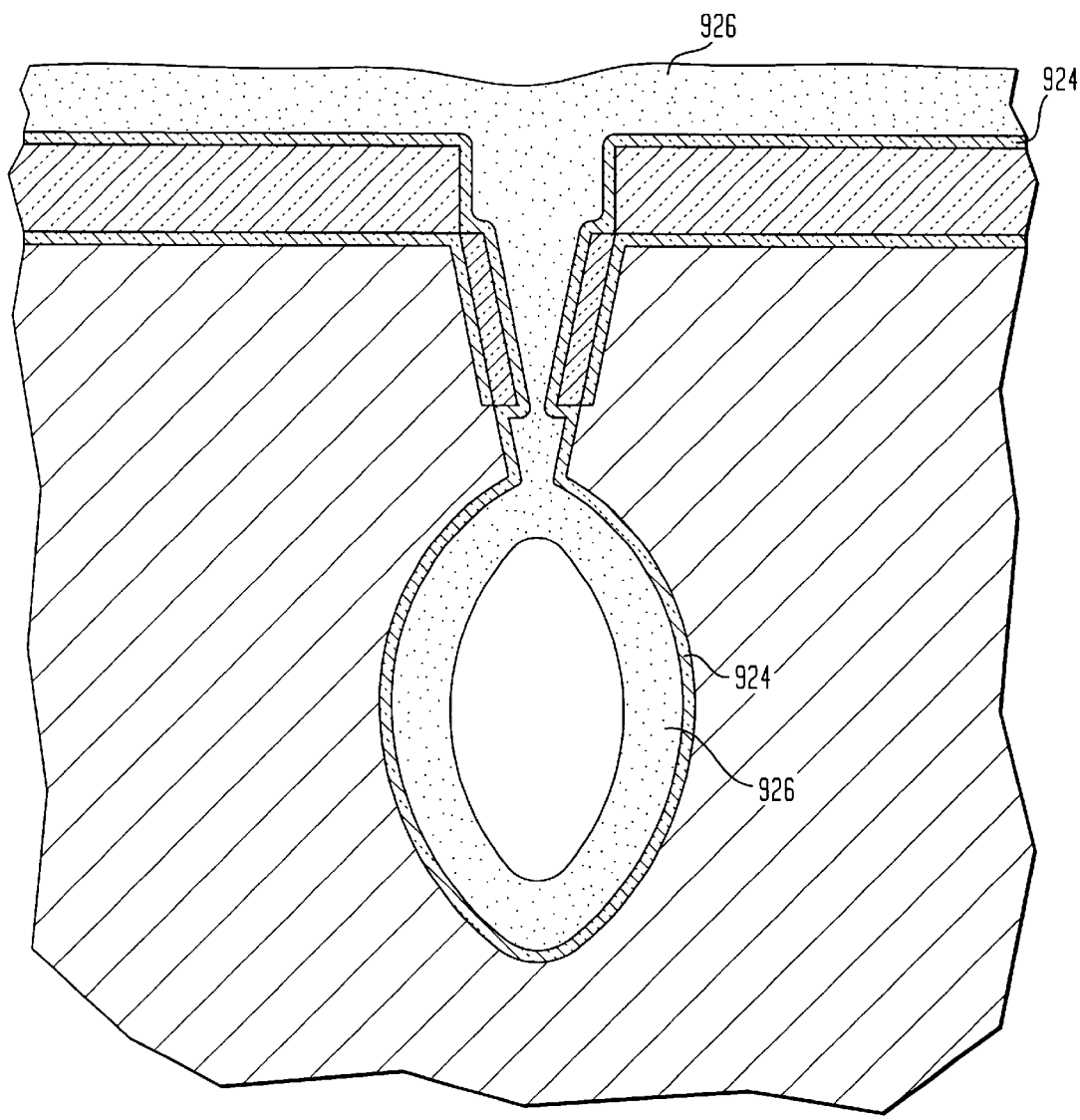

Next, the trench is filled, as indicated in FIG. 9E, with a conductive material 926, such as doped poly silicon, or amorphous silicon material, as shown in FIG. 9E and the process continues as described above in connection with FIG. 4D through 4H.

This embodiment offers the following advantages: A combined formation of the buried plate 930 and collar 922; The sidewall portions 923 (FIG. 9C) of the silicon substate 910 having the collar material 922 on them are not exposed to the out-diffusion of the dopant in the sacrificial doped poly silicon material 920; The recess of the sacrificial doped poly silicon material 920 is well controlled; and, there is effective removal of the sacrificial doped poly silicon material 922 due to the presence of the void 921.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

What is claimed is:

1. A method for fabricating a trench capacitor comprising:
   forming a bottle-shaped trench in the substrate, such trench having a diameter in a lower portion thereof greater than in an upper portion of the trench;
   depositing a sacrificial material to line walls of the trench with the sacrificial material having a substantially uniform thickness over sidewalls of the trench, and with such sacrificial material being deposited such that the trench is void of the material in an inner region of the trench;
   forming a dielectric collar in an upper portion of the trench above the sacrificial material;
   removing the sacrificial material from the lower portion of the trench;
   forming a node dielectric that lines the collar and trench sidewalls at the bottom region of the trench; and
   filling the trench with an electrically conductive material, such electrically conductive material providing an electrode of the trench capacitor.

2. The method recited in claim 1 wherein the sacrificial material comprises a doped material.

3. The method recited in claim 2 wherein the doped material fills an upper neck region of the trench while leaving said void is said inner portion of the trench.

4. The method recited in claim 3 including forming a recess in a portion of the doped material filling the upper neck portion of the trench with portions of such doped material remaining to cover an upper portion of the void in the inner region of the trench; and forming a dielectric collar in the formed recess such collar having bottom portion on the remaining portion of the doped material.

5. The method recited in claim 3 including forming a dielectric collar over the void; and, subsequent to such collar formation, out-diffusing dopant in the doped material into the substrate.

6. The method recited in claim 5 including removing a bottom portion of the collar to expose the sacrificial material; and, subsequently removing the sacrificial material from the trench.

7. The method recited in claim 6 including filling such trench with said electrically conductive material subsequent to removing the sacrificial material from the trench.

* * * * *